(12) United States Patent
Yoshimura et al.

(10) Patent No.: US 9,606,965 B2
(45) Date of Patent: Mar. 28, 2017

(54) SEMICONDUCTOR DEVICE

(71) Applicant: Hitachi, Ltd., Tokyo (JP)

(72) Inventors: Chihiro Yoshimura, Tokyo (JP);
Masato Hayashi, Tokyo (JP); Masanao Yamaoka, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 214 days.

(21) Appl. No.: 14/641,578

(22) Filed: Mar. 9, 2015

(65) Prior Publication Data

US 2016/0062951 A1    Mar. 3, 2016

(30) Foreign Application Priority Data

Aug. 29, 2014   (JP) ................................. 2014-176535

(51) Int. Cl.
*G06F 17/18* (2006.01)
*G06F 7/58* (2006.01)
(Continued)

(52) U.S. Cl.
CPC ................ *G06F 17/18* (2013.01); *G06F 7/58* (2013.01); *G06F 7/588* (2013.01); *G06N 7/005* (2013.01);
(Continued)

(58) Field of Classification Search
CPC ........ G06N 99/002; G06N 7/00–7/005; B82Y 10/00; G11C 11/16
(Continued)

(56) References Cited

U.S. PATENT DOCUMENTS

2016/0062704 A1*   3/2016   Yamaoka ............... G06N 7/005
711/104
2016/0063725 A1*   3/2016   Yoshimura ............ G06T 7/0093
382/173
(Continued)

FOREIGN PATENT DOCUMENTS

JP     09-300180 A     11/1997
JP     2004-133802 A    4/2004

OTHER PUBLICATIONS

N. Ito, Y. Kanada, "Monte carlo simulation of the ising model and random number generation on the vector processor", Proceedings of Supercomputing '90, pp. 753-763, 1990.*
(Continued)

*Primary Examiner* — Matthew Sandifer
(74) *Attorney, Agent, or Firm* — Volpe and Koenig, P.C.

(57) ABSTRACT

A semiconductor device includes a plurality of spin units individually including a memory cell configured to store values of spins in an Ising model, a memory cell configured to store an interaction coefficient from an adjacent spin that exerts an interaction on the spin, a memory cell configured to store an external magnetic field coefficient of the spin, and an interaction circuit configured to determine a subsequent state of the spin. The spin units individually include a random number generator configured to supply the random number to the plurality of spin units and generate two-valued simulated coefficients of two values or simulated coefficients of three values in performing an interaction to determine a subsequent state of a spin of the spin units from a value of a spin from an adjacent spin unit, an interaction coefficient, and an external magnetic field coefficient.

10 Claims, 23 Drawing Sheets

(51) Int. Cl.
*H03K 19/20* (2006.01)
*G06N 7/00* (2006.01)
*G06N 99/00* (2010.01)
*G11C 11/16* (2006.01)
*G11C 19/02* (2006.01)
*G11C 19/08* (2006.01)

(52) U.S. Cl.
CPC .............. *G11C 11/16* (2013.01); *G11C 19/02* (2013.01); *G11C 19/08* (2013.01); *G11C 19/0875* (2013.01); *G11C 19/0883* (2013.01); *H03K 19/20* (2013.01); *G06F 2207/58* (2013.01); *G06N 99/002* (2013.01)

(58) Field of Classification Search
USPC .............................................. 703/2; 977/933
See application file for complete search history.

(56) References Cited

U.S. PATENT DOCUMENTS

| | | | | |
|---|---|---|---|---|
| 2016/0064099 | A1* | 3/2016 | Yamaoka | G11C 29/08 365/200 |
| 2016/0065210 | A1* | 3/2016 | Yoshimura | H03K 19/0002 326/56 |
| 2016/0118106 | A1* | 4/2016 | Yoshimura | G11C 11/419 365/156 |
| 2016/0162798 | A1* | 6/2016 | Marandi | G02F 3/00 708/191 |

OTHER PUBLICATIONS

A. Gilman, A. Leist, K. A. Hawick, "3D lattice Monte Carlo simulations on FPGAs", Proc. Int. Conf. on Computer Design, 2013.*

Y. Lin, F. Wang, X. Zheng, H. Gao, L. Zhang, "Monte carlo simulation of the ising model on fpga", Journal of Computational Physics, vol. 237, pp. 224-234, 2013.*

F. Ortega-Zamorano, M. Montemurro, S. Cannas, J. Jerez, L. Franco, "FPGA Hardware Acceleration of Monte Carlo Simulations for the Ising Model", IEEE Transactions on Parallel and Distributed Systems, 2015.*

* cited by examiner

FIG. 10
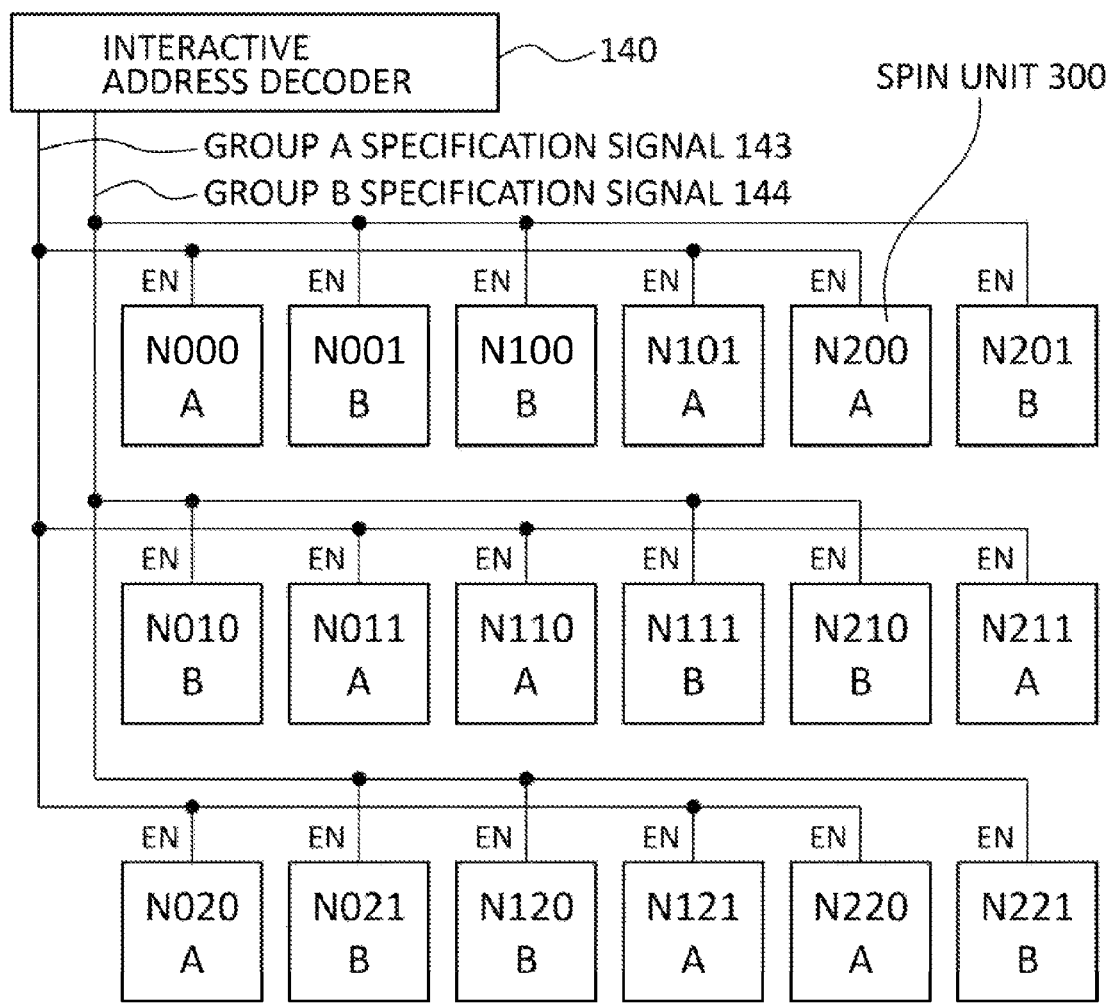
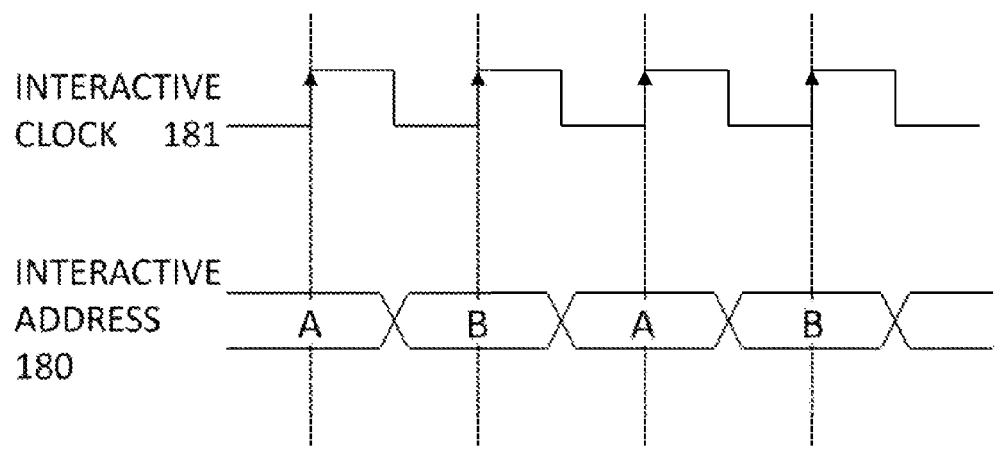

FIG. 13

| OPERATION TYPE | BIT NUMBER | BIT PROBABILITY | NUMBER OF INTERACTIONS |
|---|---|---|---|
| OR | 3 | 0.875 | 100 |
| OR | 2 | 0.75 | 110 |
| OR | 1 | 0.5 | 121 |
| AND | 2 | 0.25 | 133 |
| AND | 3 | 0.125 | 146 |
| AND | 4 | 0.0625 | 161 |
| AND | 5 | ABOUT 0.0313 | 177 |
| (OMISSION) | | | |
| AND | 20 | ABOUT $9.5 \times 10^{-7}$ | 672 |

FIG. 15
(1) EXPAND IN WORD DIRECTION
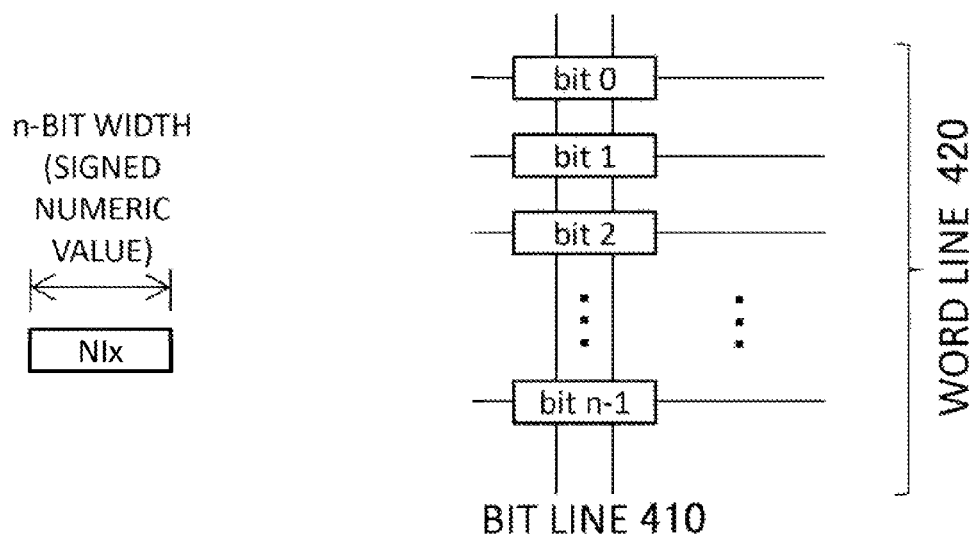
(2) EXPAND IN BIT DIRECTION
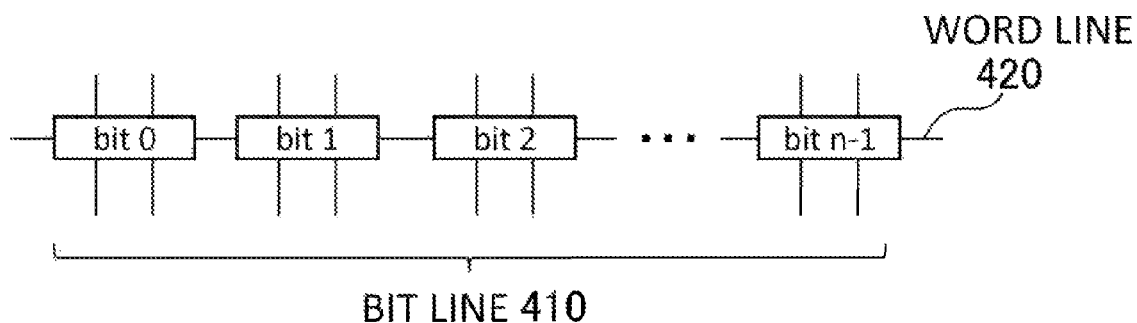

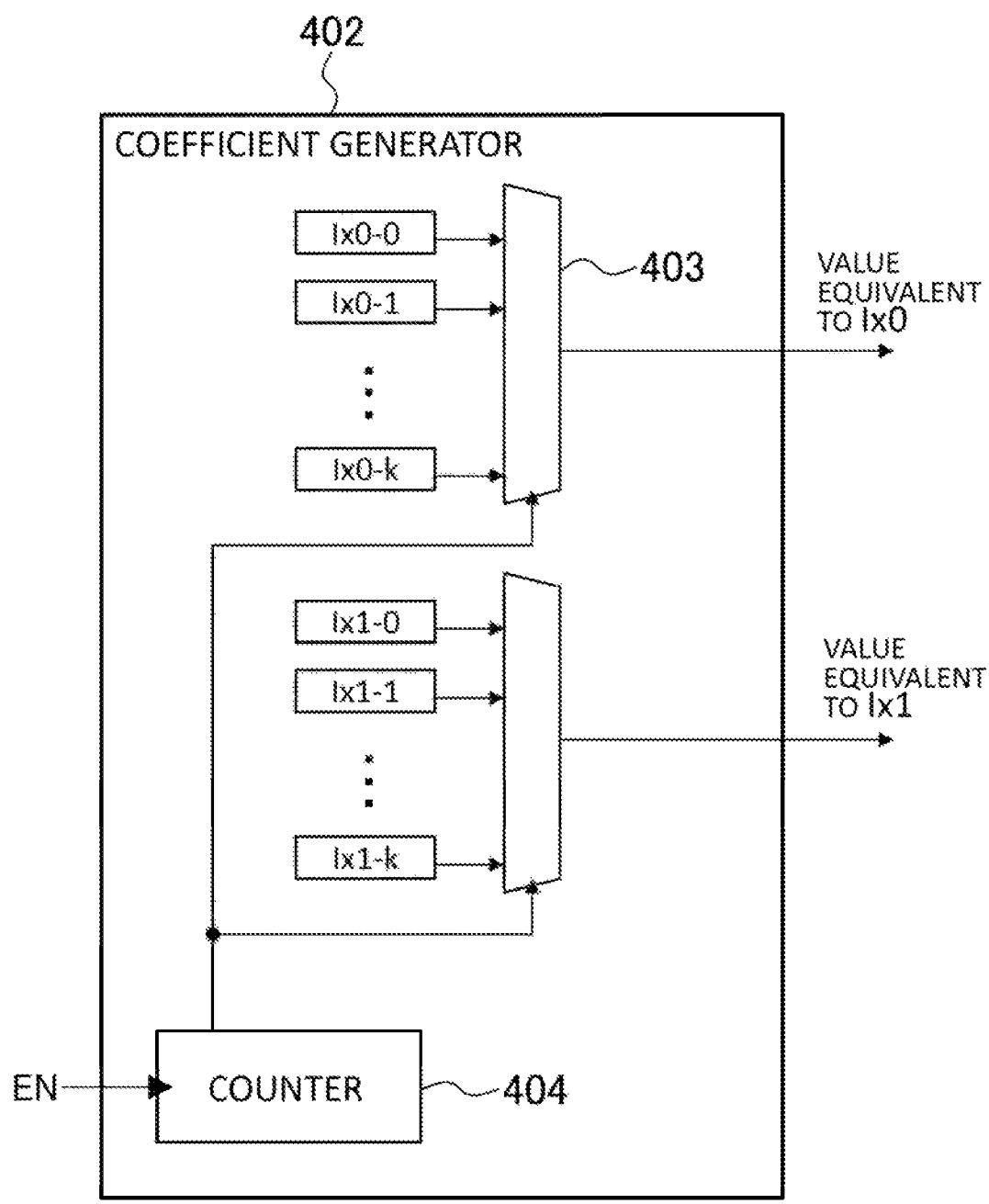

SEMICONDUCTOR DEVICE

CLAIM OF PRIORITY

The present application claims priority from Japanese application serial no. JP2014-176535, filed on Aug. 29, 2014, the content of which is hereby incorporated by reference into this application.

BACKGROUND

The present invention relates to a semiconductor device that determines the ground state of an Ising model.

Presently, the mainstream of computer architectures is of a Von Neumann type. In the Von Neumann architecture, the operation is defined by a program that is sequential instruction sequences. The Von Neumann architecture has versatility usable for various purposes by changing the program. A CPU (Central Processing Unit) that serves as a main role of a computer as well as an application-specific arithmetic and logic unit like a GPU (Graphics Processing Unit) are configured in the Von Neumann architecture, and the basic operation is the sequential execution of instruction sequences.

Up to now, the improvement of the performance of computers mainly has depended on the improvement of clock frequencies. Since the fundamental of the Von Neumann architecture is the sequential execution of instruction sequences, it is expected to improve performance when the execution speed of instructions is increased. However, in general purpose CPUs for use in personal computers and servers, the improvement of clock frequencies reaches at best around three GHz achieved in early 2000s. In recent years, instead of clock frequencies of which further improvement is not expected, a mainstream strategy is to achieve the improvement of performance by parallel processing using multiple cores.

In parallel processing using multiple cores, the improvement of performance is aimed in which portions that can be executed in a parallel manner are found from sequential instruction sequences (extraction of parallelism) and the found instruction sequences are executed in a parallel manner. However, it is not easy to extract parallelism from a program in which a sequential algorithm is written in instruction sequences. ILP (Instruction Level Parallelism), which extracts parallelism at the level of instructions, has already reached a limit. In recent years, the tendency is that parallelism of coarser granularity such as TLP (Thread Level Parallelism) and DLP (Data Level Parallelism) is used.

In view of these situations, in order to improve the performance of computers in future, it is necessary to make a shift to substantially parallel information processing, not based on the execution of sequential instruction sequences as in previously existing manners. To this end, instead of a previously existing method for describing a problem in sequential instruction sequences, such a method for describing a problem is necessary, which is suited to implementing substantially parallel information processing.

One of the candidates is an Ising model. The Ising model is a model of statistical mechanics for explaining the behavior of magnetic substances, and used for the study of magnetic substances. The Ising model is defined as the interaction between nodes (a spin that takes two values of +1/−1). It is known that the determination of the ground state of an Ising model in which the topology is a nonplanar graph is an NP hard problem. Since the Ising model expresses a problem using an interaction coefficient spread in the spatial direction, it is possible to realize information processing using substantial parallelism.

Therefore, it is desirable to perform a search for the ground state of an Ising model using a solid state component like a semiconductor device in which a large number of elements to be constituents are regularly arrayed. More specifically, such a structure is desirable that the structure is an array structure represented by a storage device such as a DRAM and an SRAM and the structure has simple elements to be constituents in order to improve integration.

The Ising model is defined by a spin that takes two values, +1/−1 (or 0/1 or up/down), an interaction coefficient expressing an interaction between spins, and an external magnetic field coefficient provided for every spin. The Ising model can calculate energy at this time from a given spin array, interaction coefficients, and an external magnetic field coefficient. A search for the ground state of an Ising model means an optimization problem that finds an array of spins to minimize the energy function of the Ising model.

The Ising model can be interpreted as one form of interaction models that express various physical phenomena and social phenomena. The interaction model is a model defined by a plurality of nodes configuring the model and interactions between the nodes, and a bias for every node, as necessary. In physics and social science, various interaction models are proposed.

The characteristic of the interaction model is in that the influence between nodes is limited to an interaction between two nodes (an interaction between two bodies). For example, when the mechanics of planets in the universe space is considered, it can also be interpreted to be one kind of interaction models in that there is an interaction between nodes, which are planets, due to universal gravitation. However, the influence between planets includes the influence between two planets as well as the influence among three planets or more, and plants are affected to one another to exhibit complicated behaviors (which is a so-called three-body problem or many-body problem).

Moreover, in the world of biology, a neural network that models a brain is one example of interaction models. The neural network has an interaction called a synaptic connection between artificial neurons using artificial neurons that imitate neurons of nerve cells for nodes. Furthermore, a bias is sometimes applied to neurons. In the world of social science, when human communications are considered, for example, it can be easily understood that there are interactions formed of languages and communications between nodes as humans. In addition, it can also be imagined that humans individually have biases. Therefore, such a study is also made that human communications are imitated to a common Ising model and the like from the viewpoint of an interaction model to reveal the characteristics of human communications.

A search for the ground state of an Ising model is used for various purposes as well as for the description of the behavior of magnetic substances, which is the original target of the Ising model. It can be said that this is because the Ising model is the simplest model based on interactions and similarly has the capability of expressing various events caused by interactions.

Moreover, a search for the ground state of an Ising model also corresponds to a maximum cut problem known as an NP hard graph problem. This graph problem has wide applications such as the detection of a community in a social network and segmentation in image processing. Therefore, when a solver that performs a search for the ground state of an Ising model is provided, a search for the ground state of an Ising model can be applied to these various problems.

SUMMARY

However, when hardware having a structure of one-to-one correspondence to an Ising model, the range of coefficients to which the hardware corresponds is limited. It is thought that in this hardware, a storage device such as a memory cells is used in order to hold a coefficient and a computing unit or an amplifier is used to exert the influence of the size of the coefficient. Therefore, the range of coefficients is restricted by the bit width of the memory cell and the computing unit and the dynamic range of the amplifier, and the like.

Moreover, generally, since it is necessary to more accurately control a large number of hardware resources and variations in hardware resources when manufactured in order to widen the bit width and the dynamic range, an amount of resources and costs are increased. Also from this viewpoint, although it is possible to theoretically assume the configuration of hardware that can implement a given coefficient, in reality, only coefficients in a certain restricted range can be provided. For one example, it is assumed that coefficients have only two values, +1 and −1, or three values, +1, 0, and −1.

Although performing a search for the ground state of an Ising model provides industrially useful applications, in order to implement a solver that performs a ground state search, a problem arises in that types of the values of coefficients are limited because of the restriction of hardware and types of Ising models to be inputted to the solver are limited.

Heretofore, in the field of combinational optimization problems in which this search is performed on a Von Neumann computer, since computational complexity is exponentially exploded to the input size of a problem, types of values forming a problem seldom causes a problem. Rather, the explosion of computational complexity in the search process after inputting a problem is a dominant problem. Therefore, as shown in Japanese Unexamined Patent Application Publication Nos. 2004-133802 and Hei 9-300180, for example, a branch and bound method that decreases computational complexity using the characteristics of a problem and a heuristic approach are used.

Therefore, other than a problem of computational complexity as described above, in the first place, types of values of coefficients that can be inputted to the solver do not become a problem in the past. However, a device that performs a search for the ground state of an NP hard Ising model at high speed can be implemented to solve a problem of computational complexity, and then the problem described above arises as a new problem.

It is an object of the present invention to implement a search for the ground state of an Ising model having a given range of coefficients using a device that performs a search for the ground state of an Ising model having a limited range of coefficients.

In order to solve the problem, an aspect of the present invention is a semiconductor device including: a plurality of spin units individually including a memory cell configured to store a value of a single spin in an Ising model, a memory cell configured to store an interaction coefficient expressing an interaction from another spin to the single spin, a coefficient regulator configured to select one from a predetermined coefficient group at a probability proportional to a size of the interaction coefficient by comparing the interaction coefficient with a random number, and an interaction circuit configured to determine a subsequent state of the spin according to the selected coefficient; and a random number generator configured to supply the random number to the plurality of the spin units.

Moreover, in an aspect of the present invention to solve the problem, in the semiconductor device, the random number supplied to the plurality of the spin units is a random pulse train.

Furthermore, in an aspect of the present invention to solve the problem, in the semiconductor device, the random number generator includes a bit controller configured to variably control a bit probability and output a random pulse train, and each time the spin unit performs an arithmetic operation for a predetermined number of times, the bit controller in turn decreases a bit probability of a random pulse train to be outputted when an arithmetic operation is performed a subsequent predetermined number of times.

In addition, in order to solve the problem, an aspect of the present invention is a semiconductor device including: a plurality of spin units individually including a memory cell configured to store values of spins in an Ising model, a memory cell configured to store an interaction coefficient from an adjacent spin that exerts an interaction on the spin, a memory cell configured to store an external magnetic field coefficient of the spin; and an interaction circuit configured to determine a subsequent state of the spin. The memory cell storing the interaction coefficient and the memory cell storing the external magnetic field coefficient are formed of a shift register that stores a simulated coefficient string generated in advance, shifts the stored simulated coefficient string, and in turn outputs a leading simulated coefficient in performing an interaction to determine a subsequent state of a spin of the spin units from a value of a spin from an adjacent spin unit, an interaction coefficient, and an external magnetic field coefficient.

Moreover, in an aspect of the present invention to solve the problem, in the semiconductor device, the memory cell storing the interaction coefficient and the memory cell storing the external magnetic field coefficient are formed of a memory cell group including a selector that stores a simulated coefficient string generated in advance, selects the stored simulated coefficient string according to a record of a counter, and in turn outputs the simulated coefficient in performing an interaction to determine a subsequent state of a spin of the spin units from a value of a spin from an adjacent spin unit, an interaction coefficient, and an external magnetic field coefficient.

According to an aspect of the present invention, as compared with mounting an interaction circuit corresponding to a desired range of coefficients, it is possible to implement various coefficients in a pseudo manner with simpler hardware, and the disclosure is applicable to various problems.

BRIEF DESCRIPTION OF THE DRAWINGS

FIG. 10 is a diagram of the relationship among grouped spin units, an interactive clock, and an interactive address;

FIG. 13 is a diagram of examples of bit probability and the number of interactions in performing a search for the ground state of an Ising model;

FIG. 15 is a diagram of a method for implementing a memory cell group holding a coefficient in n-bit width; (1) a method for expanding bits to be arranged in the array direction of word lines and (2) a method for expanding bits to be arranged in the array direction of bit lines;

FIG. 23 is a diagram of an example of mounting a coefficient generator using a memory cell and a selector.

DETAILED DESCRIPTION

In the following, embodiments will be described with reference to the drawings.

First Embodiment

In this embodiment, examples of an Ising chip 100, which is a semiconductor device that determines the ground state of an Ising model and an information processor 200 that controls the Ising chip 100 will be described.

(1) Transform a Problem to be Solved to a Problem of Searching for the Ground State of an Ising Model An Ising model is a model of statistical mechanics for explaining the behavior of magnetic substances. The Ising model is defined by a spin that takes two values, +1/−1 (or 0/1 or up/down), an interaction coefficient expressing an interaction between spins, and an external magnetic field coefficient provided for every spin.

The Ising model can calculate energy at this time from a given spin array, an interaction coefficient, and an external magnetic field coefficient. Energy function E(σ) of the Ising model, is generally expressed by the following expression (Expression 1). It is noted that suppose that $\sigma_i$ and $\sigma_j$ express the values of the ith spin and the jth spin, $J_{i,j}$ expresses an interaction coefficient between the ith spin and the jth spin, $h_i$ expresses an external magnetic field coefficient to the ith spin, <i, j> express a combination of two adjacent sites, and σ expresses an array of spins.

[Expression 1]

$$E(\sigma) = -\sum_{\langle i,j \rangle} J_{i,j}\sigma_i\sigma_j - \sum_i h_i\sigma_i \quad \text{(Expression 1)}$$

To determine the ground state of the Ising model means an optimization problem that finds an array of spins to minimize the energy function of the Ising model.

For example, optimization problems that seemingly have no relationship with magnetic substances such as a maximum cut problem can be transformed into a problem of searching for the ground state of the Ising model. The ground state of the Ising model, which is transformed and obtained, corresponds to a solution of the original problem. Thus, it can be said that a device that can search for the ground state of an Ising model is a computer usable for general purposes.

In the present embodiment, the description is made as a search for the ground state of an Ising model is taken for an example. However, it goes without saying that a search for the ground state of an Ising model can be similarly applied as the Ising model is replaced by a ground state search for an interaction model described above.

(2) The Configuration of the Ising Chip

Figure 1:
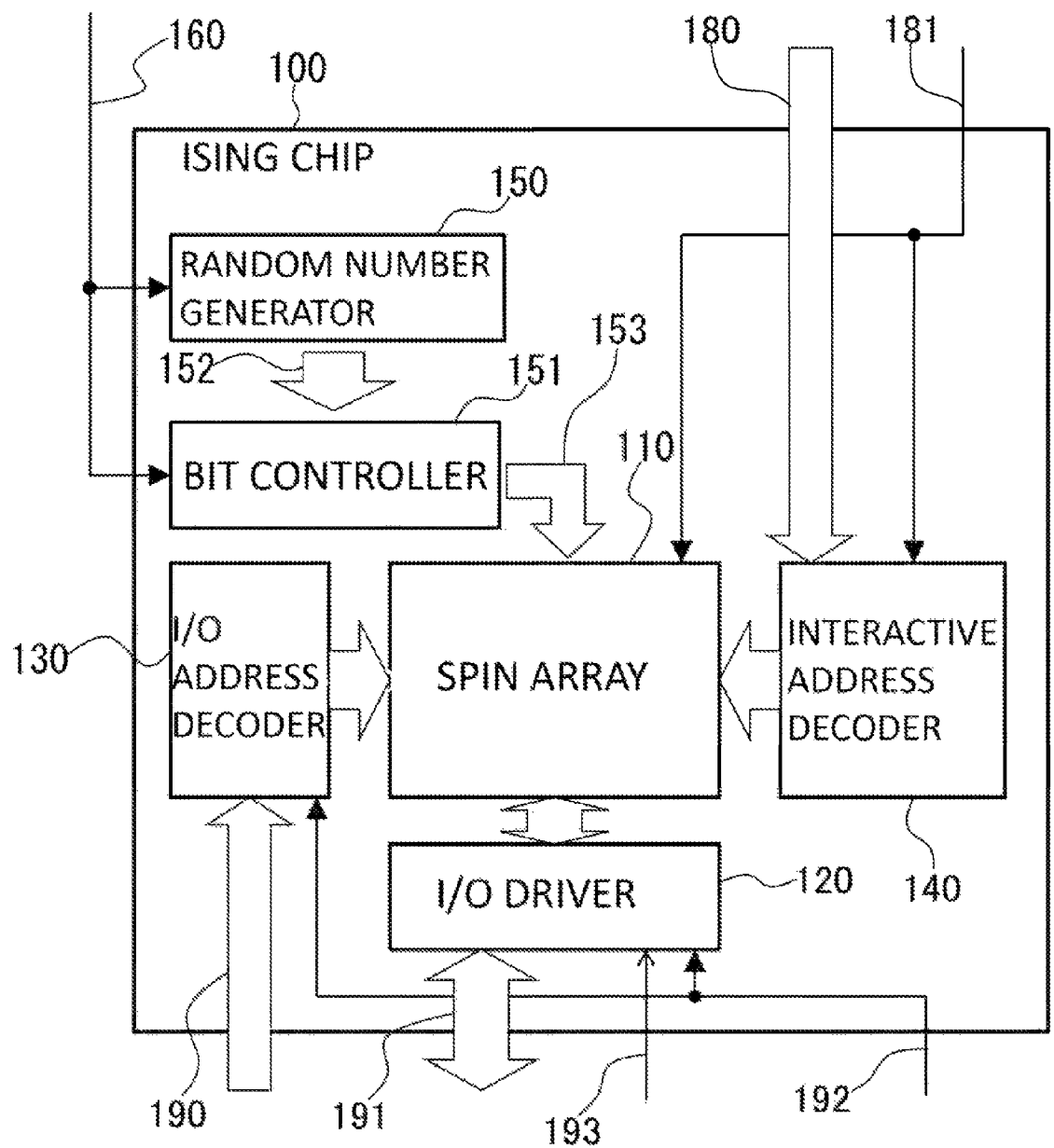
FIG. 1 is a diagram of an exemplary configuration of an Ising chip, which is a semiconductor device according to the present invention.

FIG. 1 is a block diagram of an example of the Ising chip 100 according to the present embodiment. The Ising chip 100 includes a spin array 110, an I/O driver 120, an I/O address decoder 130, an interactive address decoder 140, a random number generator 150, and a bit controller 151 as components. In the present embodiment, the description is made in the assumption that the Ising chip 100 is mounted as a CMOS integrated circuit presently widely used, and the Ising chip 100 can also be implemented using other solid state components.

As described later in FIGS. 3 and 4, the spin array 110 includes one spin and an interaction coefficient associated with the spin and a spin unit 300 that holds an external magnetic field coefficient and implements a ground state search process as a unit of basic components, and the spin array 110 is configured in which a large number of the spin units 300 are arrayed. The spin array 110 has two functions, the function of an SRAM and the function of an interaction circuit that performs a search for the ground state of an Ising model.

The I/O driver 120 and the I/O address decoder 130 are interfaces when the spin array 110 is used as an SRAM. The I/O driver 120 sends and receives a bit string to read or write from the spin array 110 through a data bus 191, and can switch between the read operation and the write operation according to a signal from a R/W control line 193.

The I/O address decoder 130 maps addresses through an address bus 190.

Both of the I/O driver 120 and the I/O address decoder 130 are operated in synchronization with an I/O clock 192.

The Ising chip 100 has an SRAM compatible interface that reads data from or writes data to the spin array 110, which is formed of the address bus 190, the data bus 191, the R/W control line 193, and the I/O clock 192. Moreover, for an interaction control interface that controls a search for the ground state of an Ising model, an interactive address 180 and an interactive clock 181 are included.

In the Ising chip 100, the spin $\sigma_i$ of the Ising model, the interaction coefficients $J_{i,j}$, and the external magnetic field coefficient $h_i$ are all expressed by information stored in memory cells in the spin array 110. In order to set the initial state of the spin and read a solution after the completion of a ground state search, the SRAM compatible interface reads or writes the spin $\sigma_i$. Furthermore, in order to set an Ising model, whose ground state is to be searched to the Ising chip 100, the SRAM compatible interface also reads or writes the interaction coefficients $J_{i,j}$ and the external magnetic field coefficient $h_i$. Therefore, addresses are allocated to the spin $\sigma_i$, the interaction coefficients $J_{i,j}$, and the external magnetic field coefficient $h_i$ in the spin array 110. It is noted that the address bus 190, the data bus 191, and the R/W control line 193 configuring the SRAM compatible interface are operated in synchronization with clocks inputted to the I/O clock 192. However, in the present invention, it is unnecessary that the interface is a synchronous interface, which may be an asynchronous interface.

In addition, in order to perform a ground state search, the Ising chip 100 implements an interaction between spins in the inside of the spin array 110. It is the interaction control interface that externally controls the interaction. More specifically, the interactive address 180 inputs the address to specify a spin group for interactions, and the interactive address decoder 140 performs interactions in synchronization with clocks inputted to the interactive clock 181 in order to use the spin array 110 for the interaction circuit. The detail of the interaction operation will be described later.

It is noted that interactions are not necessarily implemented in a clock synchronous circuit, which may be a clock asynchronous circuit. In this case, the role of the interactive clock 181 is not to receive clocks but to receive an enable signal that permits the execution of an interaction. The interaction control interface is not necessarily a synchronous interface as well, which may be an asynchronous interface. However, the description is made on the premise that in the present embodiment a synchronous interface is used and an interaction is performed in synchronization with the interactive clock 181.

Moreover, the random number generator 150 is a device that generates a random number 152 formed of a plurality of bits in a single generation of a random number. For the random number generator 150, a pseudo random number circuit including a linear feedback register that is easily implemented as an electronic circuit may be used, or a physical random number generator may be used. The bit controller 151 receives the random number 152 outputted from the random number generator 150, generates one bit of random bit 153 through an appropriate arithmetic operation, and outputs the random bit 153 to the spin array 110. Both of the random number generator 150 and the bit controller 151 are operated in synchronization with a random number generation clock 160, and generate a single random number 153 per cycle of the random number generation clock. Since the bit 153 is changed every time the random number generator 150 generates a random number, the random numbers are generated in a time series, so that random bits in a time series (a random pulse train) can be obtained. In other words, a random pulse train in synchronization with the random number generation clock 160 can be obtained.

In the present embodiment, an example is described in which the random number generator 150 and the bit controller 151 are included in the Ising chip 100. However, it may be fine that the random number generator 150 and the bit controller 151 are disposed in the outside of the chip and a random bit string (a random pulse train) is inputted to the Ising chip 100.

(3) The Configuration of the Information Processor

Figure 2:
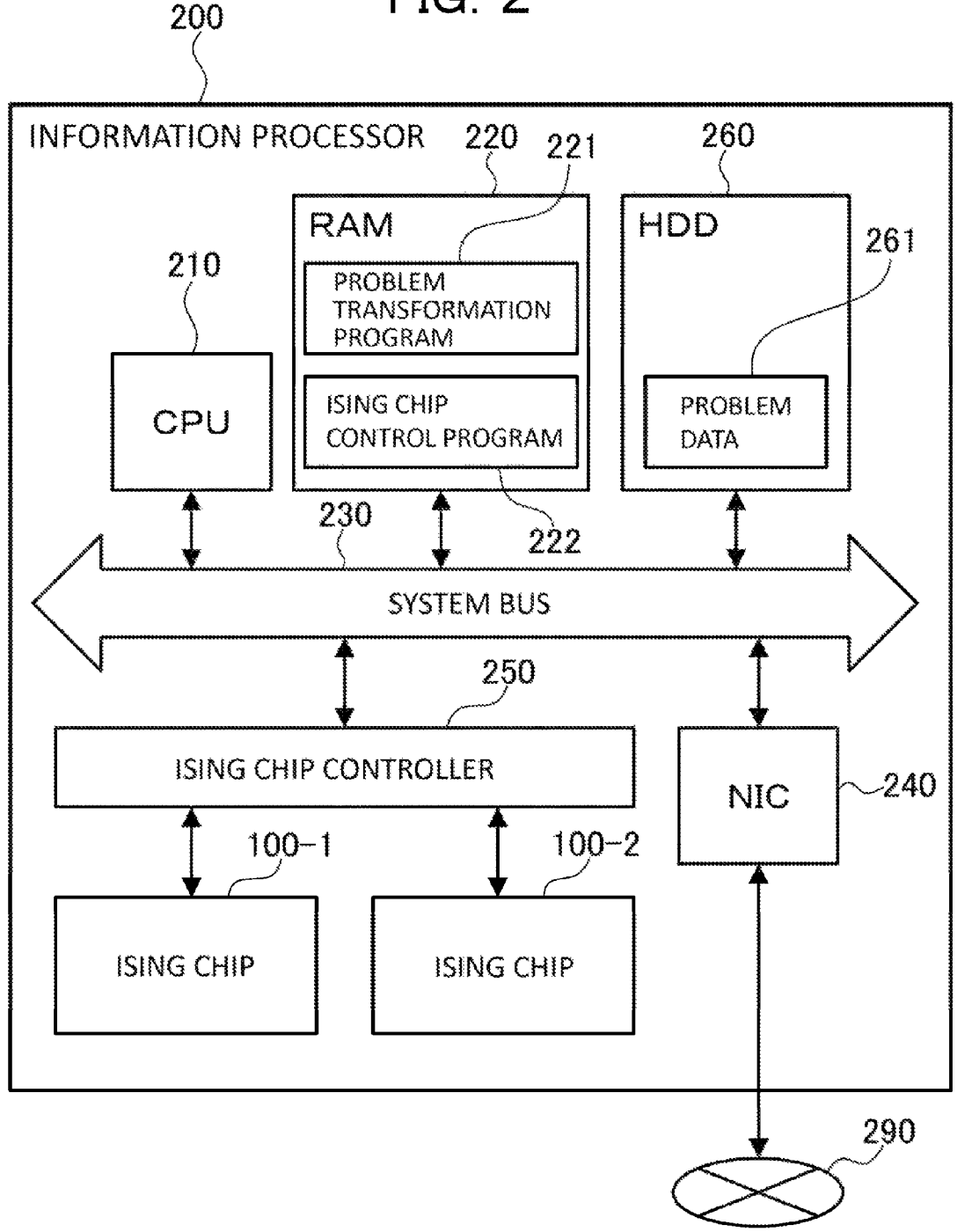
FIG. 2 is a diagram of an exemplary configuration of an information processor that controls the Ising chip, which is semiconductor device according to the present invention.

The information processor is to be implemented using one or a plurality of the Ising chips 100. To this end, it is necessary to control the interfaces described above. Thus, the Ising chip 100 is used as a part of the information processor 200 as illustrated in FIG. 2.

It can be thought that the information processor 200 is one that an accelerator configured of the Ising chip 100 is mounted on a device like a personal computer or a server presently generally used. The information processor 200 includes a CPU 210, a RAM 220, a HDD 260, and a NIC 240, which are connected through a system bus 230. This is a configuration generally observed in present personal computers and servers. In addition to this, an Ising chip controller 250 is connected to the system bus 230, and Ising chips 100-1 and 100-2 or pluralities of the Ising chips 100-1 and 100-2 are included in the subsequent stage. The Ising chip controller 250 and the Ising chip 100 correspond to an accelerator, and a form like an expansion card is formed which is inserted into a peripheral expansion interface like PCI Express, for example. The Ising chip controller 250 is one that converts the protocols of the system bus 230 (PCI Express and QPI, for example) as matched with the interfaces of the Ising chip. Software operated on the CPU 210 of the information processor 200 can control the Ising chip 100 through the Ising chip controller 250 generally by reading data from or writing data to a certain address (a so-called Memory Mapped I/O (MMIO)). Moreover, it may be fine that a plurality of information processors like this are connected through an inter-device network 290 for use.

The RAM 220 stores a problem transformation program 221 that transforms an optimization problem targeted for analysis into a search for the ground state of an Ising model and an Ising chip control program 222 that controls the Ising chip and performs a search for the ground state of an Ising model. The programs stored on the RAM 220 are executed by the CPU 21.0. The HDD 260 stores problem data 261 that expresses an optimization problem targeted for analysis. The CPU 210 controls the Ising chip 100 through the system bus 230 and reads data from and writes data to the spin array in the Ising chip.

(4) The Configuration of the Spin Array

Figure 5:
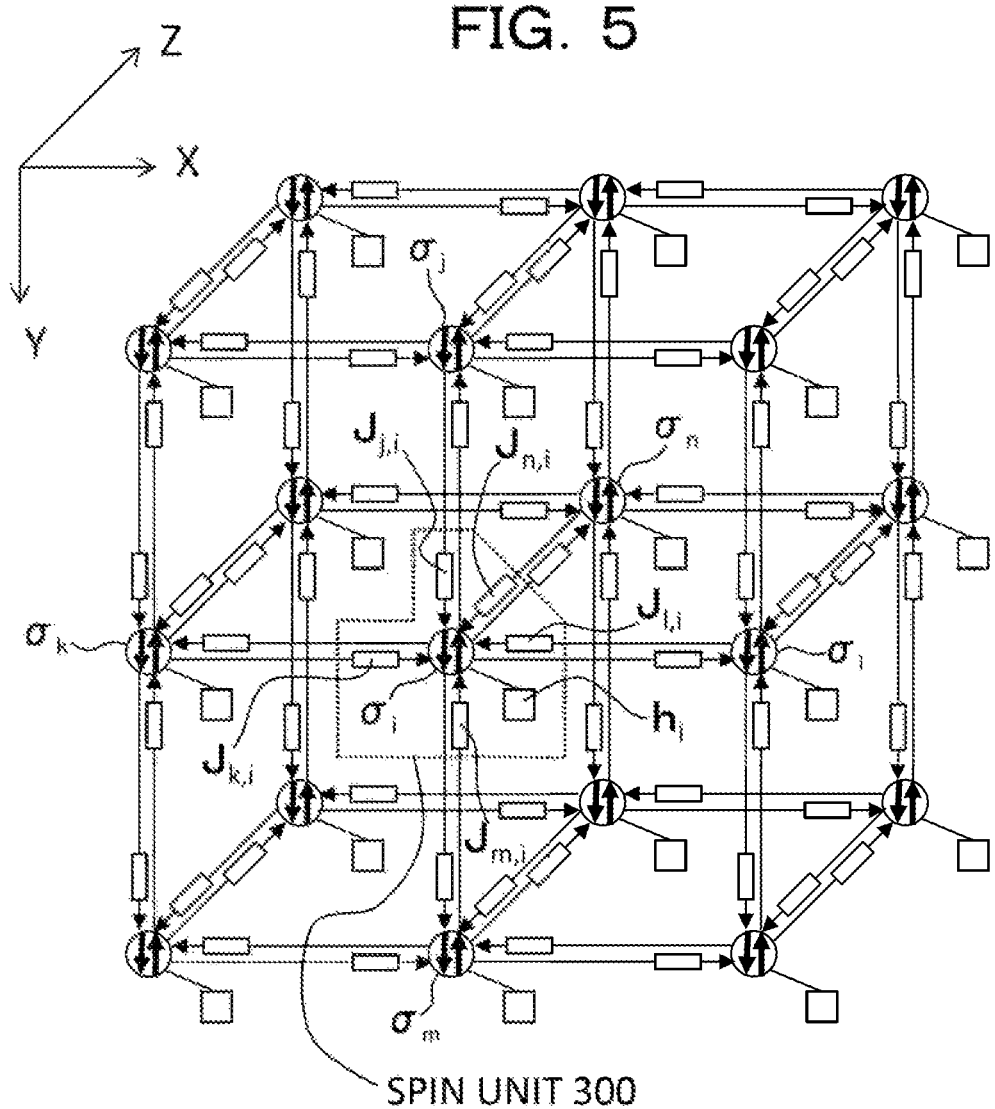
FIG. 5 is a diagram of an exemplary configuration of a spin array in a three-dimensional lattice.

The spin array 110 is configured of a spin unit 300 that holds one spin and an interaction coefficient and an external magnetic field coefficient associated with the spin and implements a ground state search process, which is a unit of basic components, in which a large number of the spin units 300 are arrayed. FIG. 5 is an example that a plurality of the spin units 300 are arrayed to configure an Ising model having a three-dimensional lattice topology. The example illustrated in FIG. 5 is a three-dimensional lattice in the size of three (in an X-axis direction) by three (in a Y-axis direction) by two (in a Z-axis direction). As illustrated in the drawing, the definition of coordinate axes is that the right direction in the drawing is the X-axis, the downward direction in the drawing is the Y-axis, and the depth direction in the drawing is the Z-axis. The coordinate axes are necessary only for convenience of the description in the present embodiment, and have no relationship with the disclosure. In the case where a topology other than the three-dimensional lattice, a tree topology, for example, is used, the number of stages of trees is used for description. In the three-dimensional lattice topology in FIG. 5, when the interaction between spins is thought as a graph, spins (vertexes) of the order five are necessary at the maximum. It is noted that in consideration of the connection to the external magnetic field coefficient as well, the order six is necessary at the maximum.

To a single spin unit 300 illustrated in FIG. 5, the values of adjacent spins, $\sigma_j$, $\sigma_k$, $\sigma_l$, $\sigma_m$, and $\sigma_n$ are inputted (for example, in the case where adjacent spins are five spins). Moreover, the spin unit 300 includes memory cells that hold interaction coefficients $J_{j,i}$, $j_{k,i}$, $j_{l,i}$, $j_{m,i}$, and $J_{n,i}$, to the adjacent spins (interaction coefficients with five adjacent spins) in addition to the spin $\sigma_i$ and the external magnetic field coefficient $h_i$.

Meanwhile, the Ising model generally has interactions expressed by an undirected graph. In Expression 1, terms expressing an interaction are $J_{i,j} \times \sigma_i \times \sigma_j$, which shows an interaction from the ith spin to the jth spin. At this time, in a typical Ising model, the interaction from the ith spin to the jth spin is not distinguished from the interaction from the jth spin to the ith spin. In other words, $J_{i,j}$ and $J_{j,i}$ are the same. However, in the Ising chip 100 according to the present invention, it is implemented that the Ising model is expanded into a directed graph, and the interaction from the ith spin to the jth spin and the interaction from the jth spin to the ith spin are in asymmetry. Thus, it is possible that the expressivity of the model is enhanced and many problems are expressed by a model in a smaller scale.

Therefore, when a single spin unit 300 is considered to be the ith spin $\sigma_i$, the interaction coefficients $J_{j,i}$, $j_{k,i}$, $j_{l,i}$, $j_{m,i}$, and $j_{n,i}$, held by this spin unit determine interactions from the adjacent jth spin $\sigma_j$, the kth spin $\sigma_k$, the lth spin $\sigma_l$, mth spin $\sigma_m$, the nth spin $\sigma_n$, to the ith spin $\sigma_i$. This corresponds to that in FIG. 5, arrows (interactions) corresponding to the interaction coefficients included in the spin unit 300 are directed from spins in the outside of the spin unit 300 to the spin in the inside of the spin unit 300.

(5) The Configuration of the Spin Unit

An exemplary configuration of the spin unit 300 will be described with reference to FIGS. 3 and 4. The spin unit 300 has two aspects. For convenience, the aspects will be described separately in FIGS. 3 and 4, and a single spin unit 300 includes both configurations in FIGS. 3 and 4. FIG. 3 is a circuit that implements the interaction between spin units, and FIG. 4 is a circuit that attention is focused on word lines and bit lines, which are interfaces to make access to the memory cells included in the spin unit from the outside of the Ising chip 100. It is noted that how to connect interfaces EN, NU, NL, NR, ND, NF, and N illustrated in the circuit that implements the interaction in FIG. 3 among a plurality of spin units will be described later with reference to FIGS. 9 and 10. Moreover, how to connect the word lines to the bit lines in 1o FIG. 4 among a plurality of spin units will be described later with reference to FIG. 8.

In order to hold the spin $\sigma_i$, the interaction coefficients $J_{j,i}$, ... $J_{n,i}$, and the external magnetic field coefficient $h_i$ of the Ising model, the spin unit 300 includes a plurality of one-bit memory cells. The one-bit memory cells are illustrated in FIGS. 3 and 4 as N, IS0, IS1, IU0, IU1, IL0, IL1, IR0, IR1, ID0, ID1, IF0, and IF1. It is noted that since IS0 and IS1, IU0 and IU1, IL0 and IL1, IR0 and IR1, ID0 and ID1, and IF0 and IF1 (302) serve in a pair, they are collectively abbreviated to ISx, IUx, ILx, IRx, IDx, and IFx.

Here, the spin unit 300 will be described that the spin unit 300 expresses the ith spin. The memory cell N301 is a memory cell that expresses the spin $\sigma_i$ and holds the value of the spin. The value of the spin is +1 or −1 (+1 is also expressed as up, and −1 is also expressed as down) in the Ising model, and corresponds to 0 and 1, which are two values of the memory cell. For example, +1 corresponds to 1, and −1 corresponds to 0.

Figure 6:
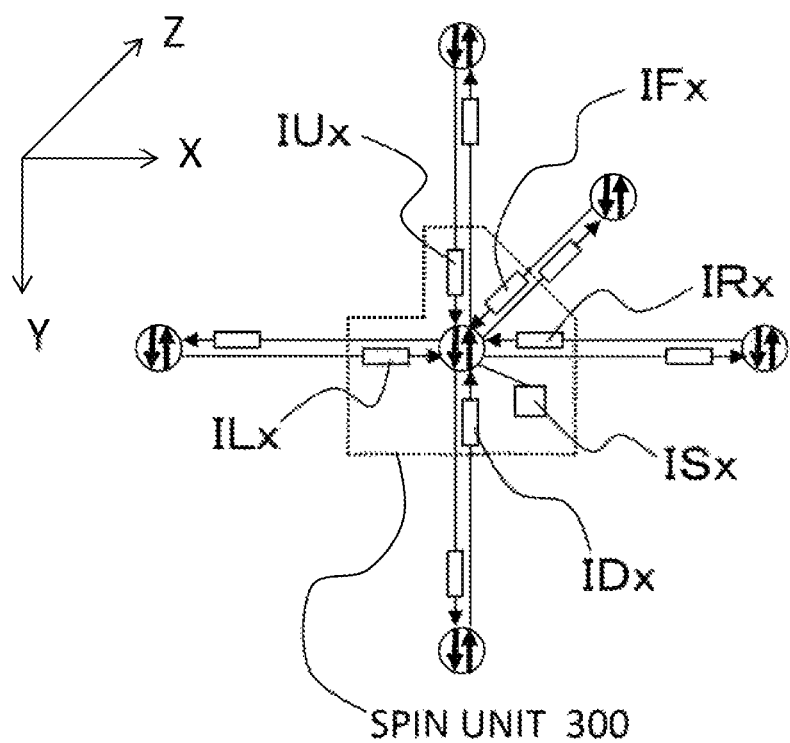
FIG. 6 is a diagram of the corresponding relationship between a memory cell and the topology of a spin array in the spin unit.

FIG. 6 is the corresponding relationship between the memory cells included in the spin unit 300 and the topology of the Ising model illustrated in FIG. 5. ISx expresses an external magnetic field coefficient. Moreover, IUx, ILx, IRx, IDx, and IFx express interaction coefficients. IUx is the interaction coefficient with the spin on the upper side (−1 in the Y-axis direction), ILx is the interaction coefficient with the spin on the left side (−1 in the X-axis direction), IRx is the interaction coefficient with the spin on the right side (+1 in the X-axis direction), IDx is the interaction coefficient with the spin on the lower side (+1 in the Y-axis direction), and IFx is the interaction coefficient with the spin connected in the depth direction (+1 or −1 in the Z-axis direction). Moreover, in the case where the Ising model is thought as a directed graph, a certain spin observes the other spins that have coefficients of influence exerted on the certain spin. The coefficient of influence exerted on the other spins by the certain spin belongs to the other spins. In other words, this spin unit 300 is connected to five spins at the maximum. In the Ising chip 100 according to the present embodiment, the coefficients correspond to three values of +1, 0, and −1 for the external magnetic field coefficient and the interaction coefficients. Therefore, in order to express the external magnetic field coefficient and the interaction coefficients, two-bit memory cells are necessary. ISx, IUx, ILx, IRx, IDx, and IFx express three values of +1, 0, and −1, in the combination of two memory cells having the tail numerical characters of 0 and 1 (for example, in the case of ISx, a combination of IS0 and IS1). For example, in the case of ISx, IS1 expresses +1/−1. When IS1 is 1, IS1 expresses +1, and when IS1 is 0, IS1 expresses −1. In addition to this, when IS0 is 0, the external magnetic field coefficient is considered to be zero, and when IS0 is one, any one value +1 or −1 determined by IS1 is the external magnetic field coefficient. When it is thought that IS0 disables the external magnetic field coefficient when the external magnetic field coefficient is zero, it can be said that IS0 is the enable bit of the external magnetic field coefficient (the external magnetic field coefficient is enabled when IS0=1). The coefficients IUx, ILx, IRx, IDx, and IFx that express interaction coefficients are similarly matched with the bit values.

It is necessary that the memory cells N, IS0, IS1, IU0, IU1, IL0, IL1, IR0, IR1, ID0, ID1, IF0, and IF1 in the spin unit 300 can be externally read or written from the outside of the Ising chip 100. To this end, as illustrated in FIG. 4, the spin unit 300 includes bit lines 410 and word lines 420. The spin units 300 are arrayed in tiles on a semiconductor substrate to connect the bit lines 410 to the word lines 420, and the spin units 300 are driven, controlled, written, and read using the I/O address decoder 130 and the I/O driver 120, so that the memory cells in the spin unit 300 can be read and written through the SRAM compatible interface of the Ising chip 100, similarly to a typical SRAM (Static Random Access Memory).

(6) The Disposition of the Spin Units in the Spin Array

Figure 7:
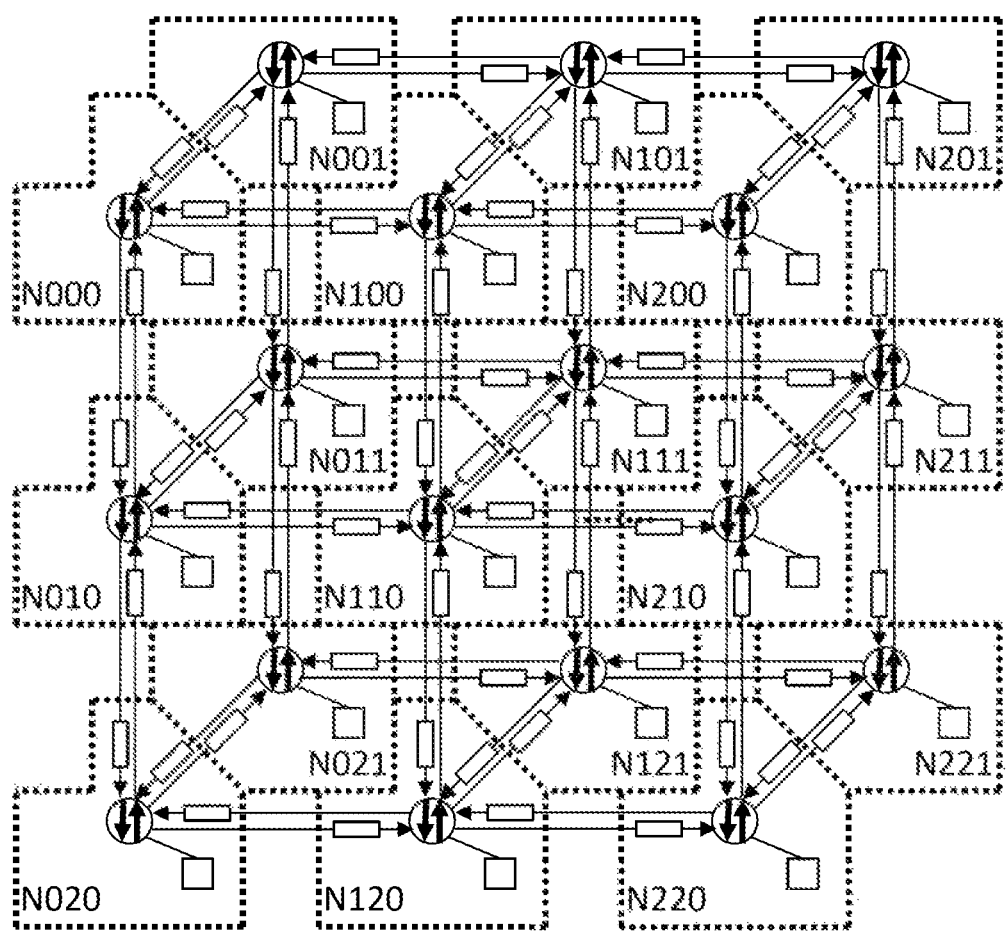
FIG. 7 is a diagram of an exemplary corresponding relationship between the spin array in a three-dimensional lattice and the spin unit.
Figure 8:
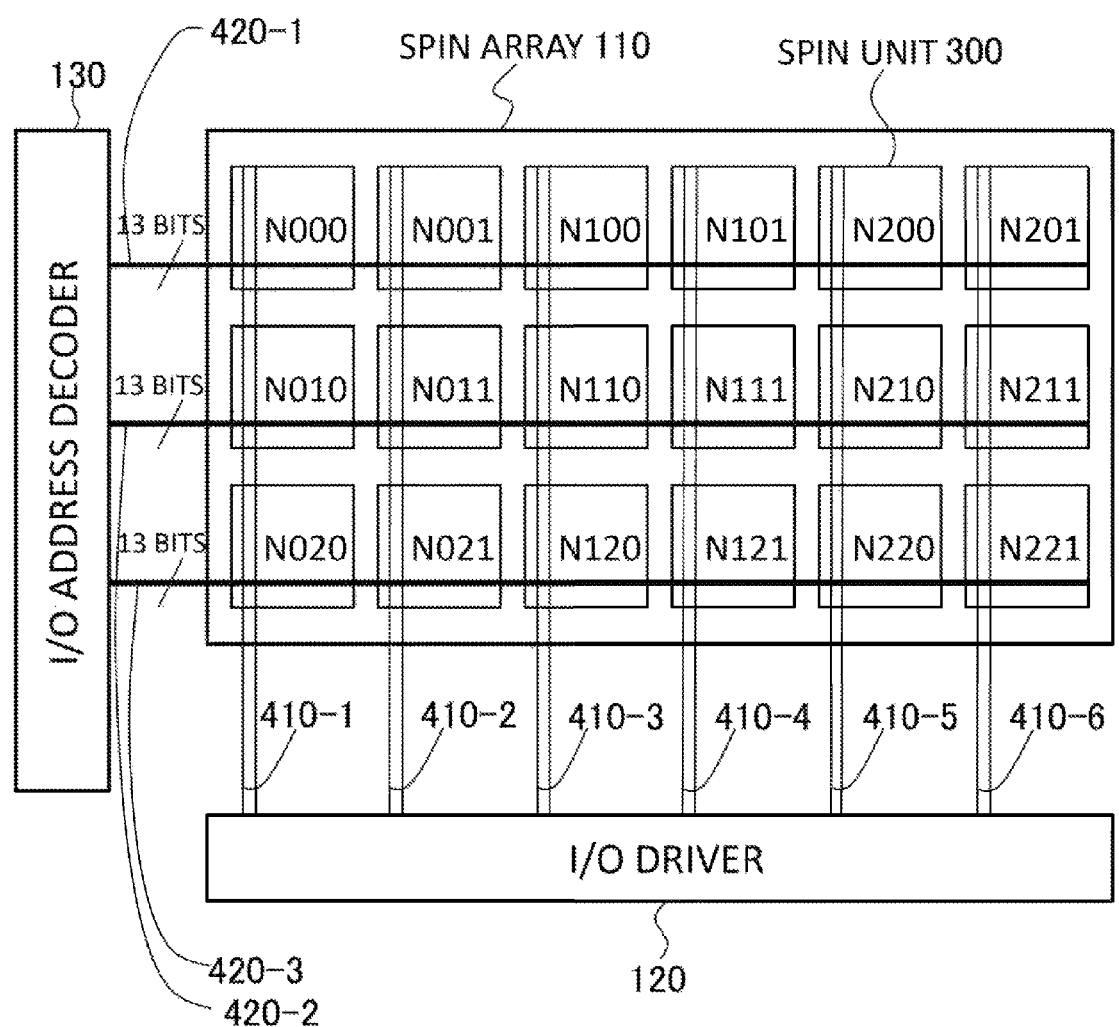
FIG. 8 is a diagram of an exemplary disposition of spin units on the Ising chip.

The configuration of the spin array 110 will be described with reference to FIG. 8 from the viewpoint of the layout of a semiconductor device. Since the spin array 110 according to the present embodiment has a three-dimensional lattice topology as illustrated in FIG. 5, in order to implement the spin array 110 as a semiconductor device forming a circuit on a two-dimensional plane, some schemes are necessary for the layout. Therefore, a disposition as illustrated in FIG. 8 is provided. It is noted that FIG. 7 is a diagram that which vertexes correspond to the spin unit 300 expressed in FIG. 8 (signs are assigned on positions on the X-axis, the Y-axis, on the Z-axis as Nxyz) on a three-dimensional lattice topology. In order to dispose the vertexes of a three-by-three-by-two three-dimensional lattice on a two-dimensional plane, the vertexes are disposed in such a manner that the lattice vertexes of the lattice vertex array in the Z-axis direction are inserted into the gaps in the lattice vertex array in the X-axis direction. In other words, in the Y-axis direction (the lower side of the drawing is the Y-axis in the positive direction) on the two-dimensional plane in FIG. 8, vertexes Nx0z, Nx1z, and Nx2z are disposed, and in the X-axis direction (the right side of the drawing is the positive direction of the X-axis), spin units having the Z-axis direction coordinate 0 or 1 are alternately disposed as N0y0, N0y1, N1y0, N1y1, N2y0, and N2y1.

Physically, the spin units 300 are disposed on the Ising chip 100 as illustrated in FIG. 8, and word lines 420-1, 420-2, and 420-3 are connected to bit lines 410-1, 410-2, 410-3, 410-4, 410-5, and 410-6 as illustrated in FIG. 8. These word lines and bit line are connected to the word lines 420 and the hit lines 410 of the spin unit 300 illustrated in FIG. 4. Since the spin units 300 include 13 memory cells in the array direction of the word lines, the word lines 420-1, 420-2, and 420-3 individually have 13 bits.

(7) The Control of the Ground State Search Process for the Ising Model

In order to implement a search for the ground state of the Ising model, it is necessary to implement the interaction between spins in such a manner that the energy of the entire Ising model is transitioned to a lower spin array. The interaction for this purpose is performed based on a given interaction coefficient and a given external magnetic field coefficient. In other words, the subsequent value of a certain spin is determined from interactions from the other spins connected to the certain spin and the external magnetic field coefficient of the certain spin. At this time, the subsequent value of the certain spin is a value that minimizes local energy in a region in which the certain spin is connected.

To update the certain spin, it can be first thought that the spins are sequentially updated one by one. However, in this method, time is required proportional to the number of spins, and it is not enabled to use parallelism. Therefore, it is desirable to concurrently perform interactions among all the spins.

However, in the case where all the spins are updated at the same time, in the update of a certain spin, the certain spin is updated in such a manner that the value of the adjacent spin is referenced and energy is minimized between the certain spin and the adjacent spin. Therefore, when the value of the adjacent spin is updated at the same, two updates are overlapped with each other, energy is not enabled to be minimized, and vibrations occur. In other words, when a certain spin is updated, it is not enabled to update spins connected to the certain spin at the same time (in the following, the spins directly connected to the certain spin through interaction coefficients are referred to as adjacent spins).

Therefore, in the present invention, in order not to update adjacent spins at the same time, the spin units 300 in the spin array 110 are grouped, and only one group is updated at the same time. It may be fine that in the topology as illustrated in FIG. 5, the spin units 300 are divided into two groups. The two groups are alternately updated. In order to specify a group to be updated at some timing, the Ising chip 100 uses the interactive address 180 as an input interface. The interactive address 180 is an interface that specifies a group to be updated in the groups described above, and the spins (the spin units 300) belonging to the group specified by the interactive address 180 are updated at the same time by the input of the interactive clock 181.

It may be fine that when this method is used, it is unnecessary to provide additional hardware in the spin unit 300 and only a pair of the interactive address decoders 140 is provided in the entire Ising chip 100. Therefore, the problems above can be solved without complicating the spin unit 300, which is a constituent.

The grouping will be described with reference to FIG. 10. In FIG. 10, the spin units Nxyz are grouped into two groups, group A and group B. As described later, the spin units 300 include an interface (EN) that inputs a signal to permit the update of spins. Therefore, an address specified by the interactive address 180 (the identifier of a group) is decoded by the interactive address decoder 140, and update permission signals for individual groups are generated. In the example in FIG. 10, a group A specification signal 143 and a group B specification signal 144 are update permission signals for individual groups.

The spin units belonging to a group that an update is permitted at this time is then updated by the interactive clock 181. It is noted that the adjacent spins always belong to different groups in the topology in FIG. 5 because of grouping illustrated in FIG. 10.

(8) The Circuit Configuration that Determines the Subsequent State of the Spin Included in the Spin Unit The spin unit 300 includes a circuit that calculates an interaction and determines the subsequent state of the spin in order to update spin units at the same time separately for the individual spin units. A circuit (an interaction circuit) 303 that determines the subsequent state of the spin is illustrated in FIG. 3. In FIG. 3, the spin unit includes the interfaces EN, NU, NL, NR, ND, NF, and N to the outside. EN is an interface that inputs a signal to permit the update of spins of the spin unit. N is an interface that outputs the value of the spin of the spin unit to the other spin units (the adjacent units in the topology in FIG. 5). NU, NL, NR, ND, and NF are interfaces that inputs the values of the spins included in the other spin units (the adjacent units in the topology in FIG. 5). NU is an input from the spin on the upper side (−1 in the Y-axis direction), NL is an input from the spin on the left side (−1 in the X-axis direction), NR is an input from the spin on the right side (+1 in the X-axis direction), ND is an input from the spin on the lower side (+1 in the Y-axis direction), and NF is an input from the spin connected in the depth direction (+1 or −1 in the Z-axis direction). It is noted that when the topology of the Ising model is considered, it is necessary to determine a process at the end. When the end is simply terminated as in the topology in FIG. 5, it may be fine that one for the end inputs nothing in NU, NL, NR, ND, and NF (on the circuit, an appropriate process is performed as an unused input terminal; it is connected to a fixed value 0 or 1, for example). For example, in the case of the spin unit N000, two terminals NU and NL have no input.

In the spin unit 300, the subsequent state of the spin is determined in such a manner that energy is minimized between the spin and the adjacent spin. This is equivalent to the determination which one of the positive value and the negative value is dominant when the product of the adjacent spin and the interaction coefficient and the external magnetic field coefficient are considered. For example, the subsequent state of the spin $\sigma_i$ is determined as follows, where the spins $\sigma_j$, $\sigma_k$, $\sigma_l$, $\sigma_m$, and $\sigma_n$ are adjacent to the ith spin $\sigma_i$. First, suppose that the values of the adjacent spins are $\sigma_j=+1$, $\sigma_k=-1$, $\sigma_l=+1$, $\sigma_m=-1$, and $\sigma_n=+1$, the interaction coefficients are $J_{j,i}=+1$, $j_{k,i}=+1$, $j_{l,i}=+1$, $j_{m,i}=-1$, and $J_{n,i}=-1$, and the external magnetic field coefficient is $h_i=+1$. At this time, when the products of the interaction coefficients and the adjacent spins and the external magnetic field coefficient are arranged, the following is obtained: $\sigma_j \times J_{j,i}=+1$, $\sigma_k \times j_{k,i}=-1$, $\sigma_l \times j_{l,i}=+1$, $\sigma_m \times j_{m,i}=+1$, $\sigma_n \times J_{n,i}=-1$, and $h_i=+1$. It may be fine that it can be read differently that the external magnetic field coefficient is an interaction coefficient with a spin whose value is always +1.

Here, local energy between the ith spin and the adjacent spin is energy obtained by individually multiplying the coefficients described above by the value of the ith spin and inverting the sign. For example, the value of local energy with the jth spin is −1 when the ith spin is +1, and +1 when the ith spin is −1. Thus, when the ith spin is +1, local energy here becomes smaller. When such local energy is considered on all the adjacent spins and on the external magnetic field coefficient, calculation is made which value is assigned to the ith spin, +1 or −1, to decrease energy. It may be fine to count which one is greater, +1 or −1, in an array of the products of the interaction coefficients and the adjacent spins and the external magnetic field coefficient shown above. In the example above, there are four +1s and two −1s. Supposing that when the ith spin is +1, the sum total of energy is −2, whereas when the ith spin is −1, the sum total of energy is +2. Thus, the subsequent state of the ith spin that energy is minimized can be determined by a majority in which when the number of +1 is greater, the subsequent state of the ith spin is +1, whereas when the number of −1 is greater, the subsequent state of the ith spin is −1.

Figure 3:
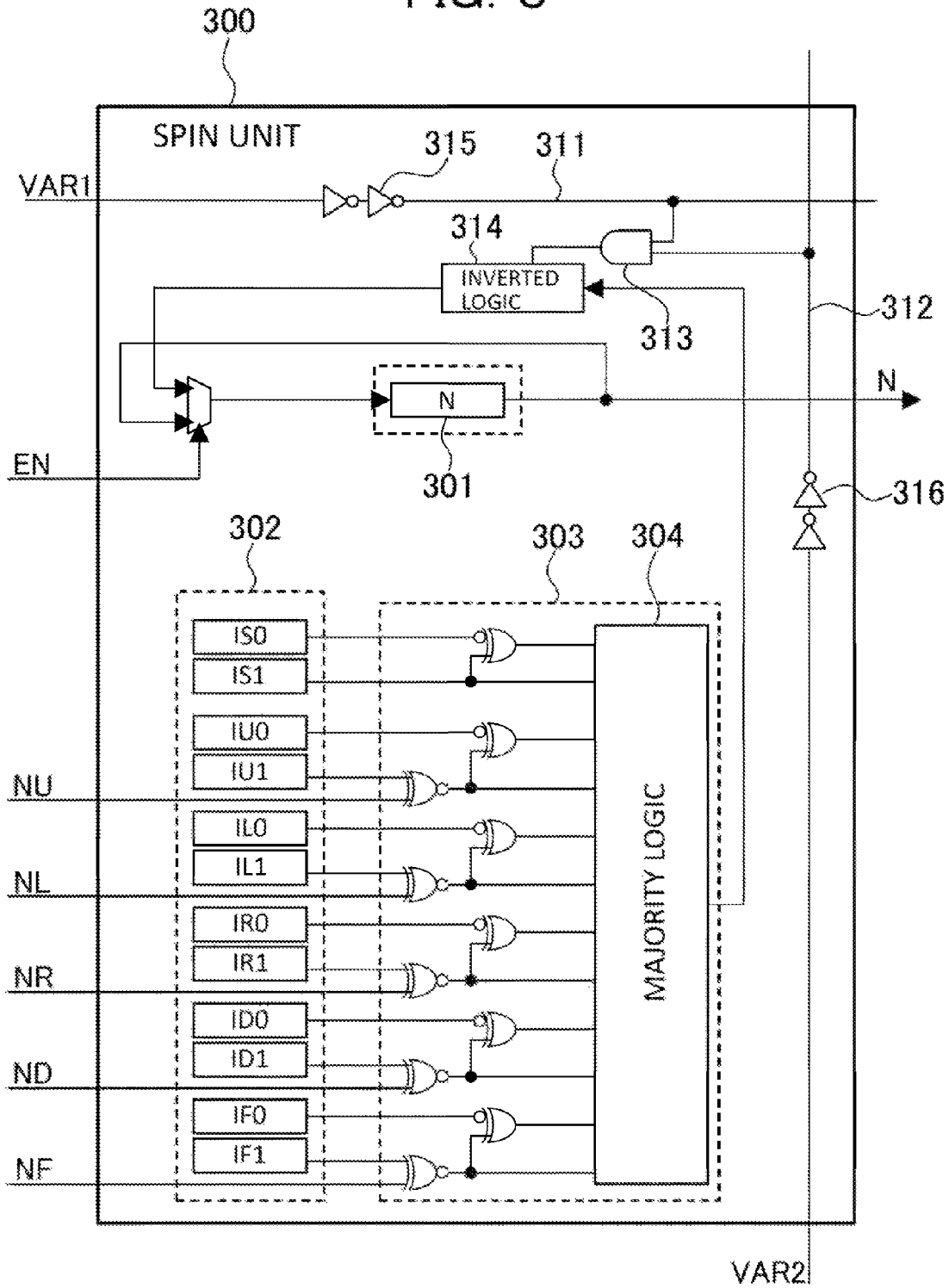
FIG. 3 is a diagram of an exemplary configuration of a spin unit for describing the configuration of a circuit that causes an interaction between spin units.
Figure 4:
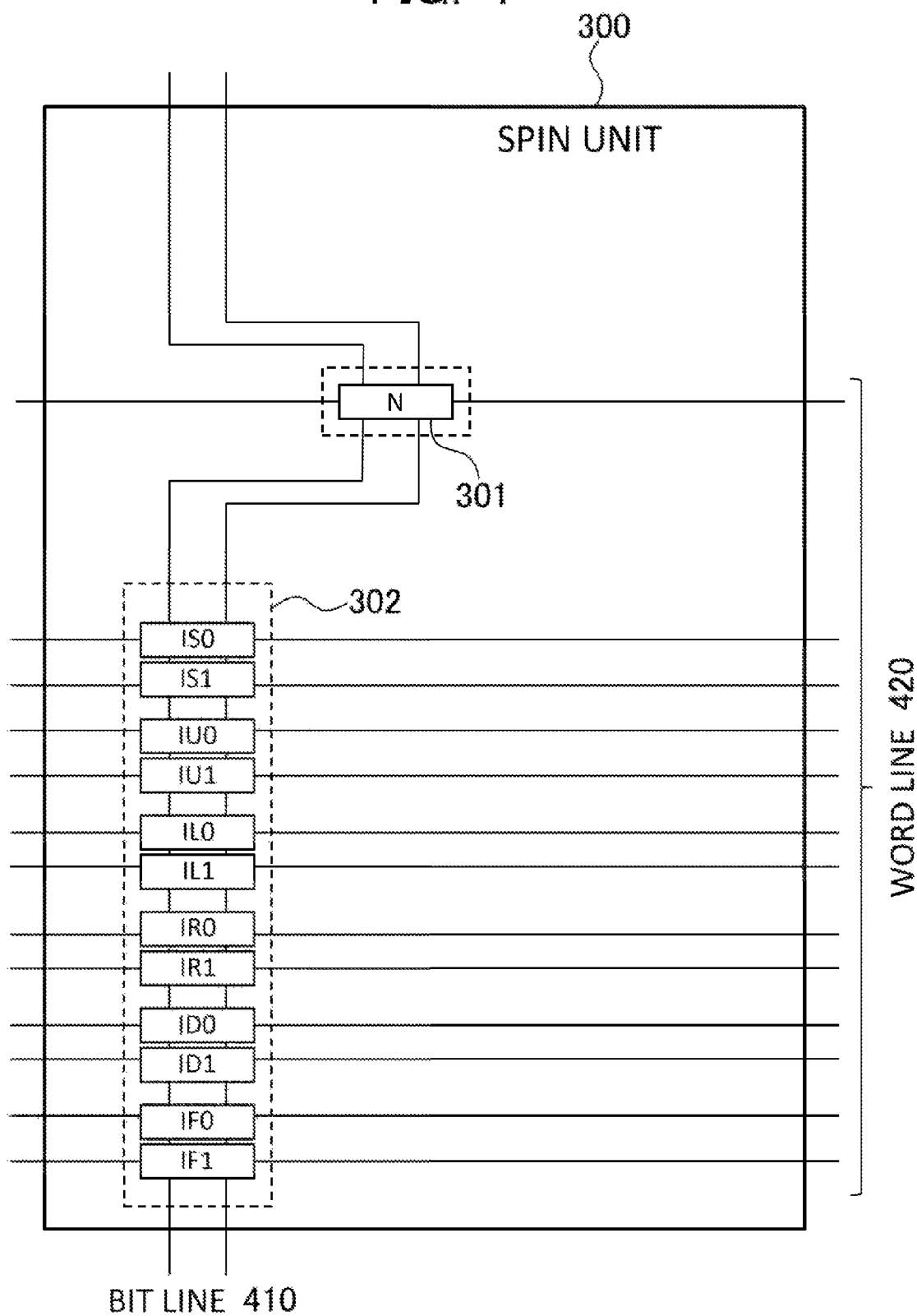
FIG. 4 is a diagram of an exemplary configuration of the spin unit for describing the configuration to make access to memory cells included in the spin unit.

A logic circuit illustrated in the spin unit 300 in FIG. 3 is the circuit 303 that performs the interaction described above. First, based on an exclusive NOR (XNOR) between memory cells expressing the value +1/−1 for the state of the adjacent spin and the interaction coefficient, the subsequent state of the spin that energy is minimized can be calculated when only the interaction is considered (suppose that +1 is encoded to 1 and −1 is encoded to 0). If the interaction coefficient includes only +1 and −1, a decision is made by a majority logic which is greater in the output, +1 or −1, and the subsequent state of the spin can be determined. As for the external magnetic field coefficient, when it is thought that the external magnetic field coefficient always corresponds to the interaction coefficient with the spin in the +1 state, the value of the external magnetic field coefficient is simply the value to be inputted to the majority logic that determines the subsequent state of the spin.

Next, let us consider a method for implementing the coefficient 0. It can be said that when there is majority logic f having n inputs ($I_1, I_2, I_3, \ldots, I_n$), a proposition below is true. First, suppose that there are replications $I'_1$, $I'_2$, $I'_3, \ldots$, and $I'_n$ for the inputs $I_1, I_2, I_3, \ldots$, and $I_n$ (for a given k, $I_k=I'_k$). At this time, the output of f ($I_1, I_2, I_3, \ldots, I'_n$) is equal to f ($I_1, I_2, I_3, \ldots, I_n, I'_1, I'_2, I'_3, \ldots, I'_n$) having inputs together with the replications. In other words, even though two each of the input variables are inputted, the output is invariant. Furthermore, suppose that there are another input Ix and inverted !Ix of the input Ix, in addition to the inputs $I_1, I_2, I_3, \ldots$, and $I_n$. At this time, the output of f ($I_1, I_2, I_3, \ldots, I_n$, Ix, !Ix) is equal to f ($I_1, I_2, I_3, \ldots, I_n$). In other words, when the input variable and the inverted input variable are inputted, they work so as to cancel the influence of the input variable in the majority. The coefficient 0 is implemented using the nature of the majority logic. More specifically, as illustrated in FIG. 3, depending on the value of a bit (IS0, for example) that determines the enable of the coefficient using XOR, the replication of the value to be a candidate for the subsequent state of the spin describe above and the inverted replication are inputted to the majority logic at the same time. For example, in the case where IS0 is zero, the value of IS1 and the inverted value of IS1 are inputted to the majority logic at the same time, the influence of the external magnetic field coefficient is not exerted (this corresponds to that the external magnetic field coefficient is zero). Moreover, in the case where IS0 is one, the value of IS1 and the same value (the replication) as the value of IS1 are inputted to the majority logic at the same time.

The output of the majority logic is then stored as the subsequent state of the spin $\sigma_i$ on the memory cell. N301.

(9) Interconnections Between the Spin Units

Figure 9:
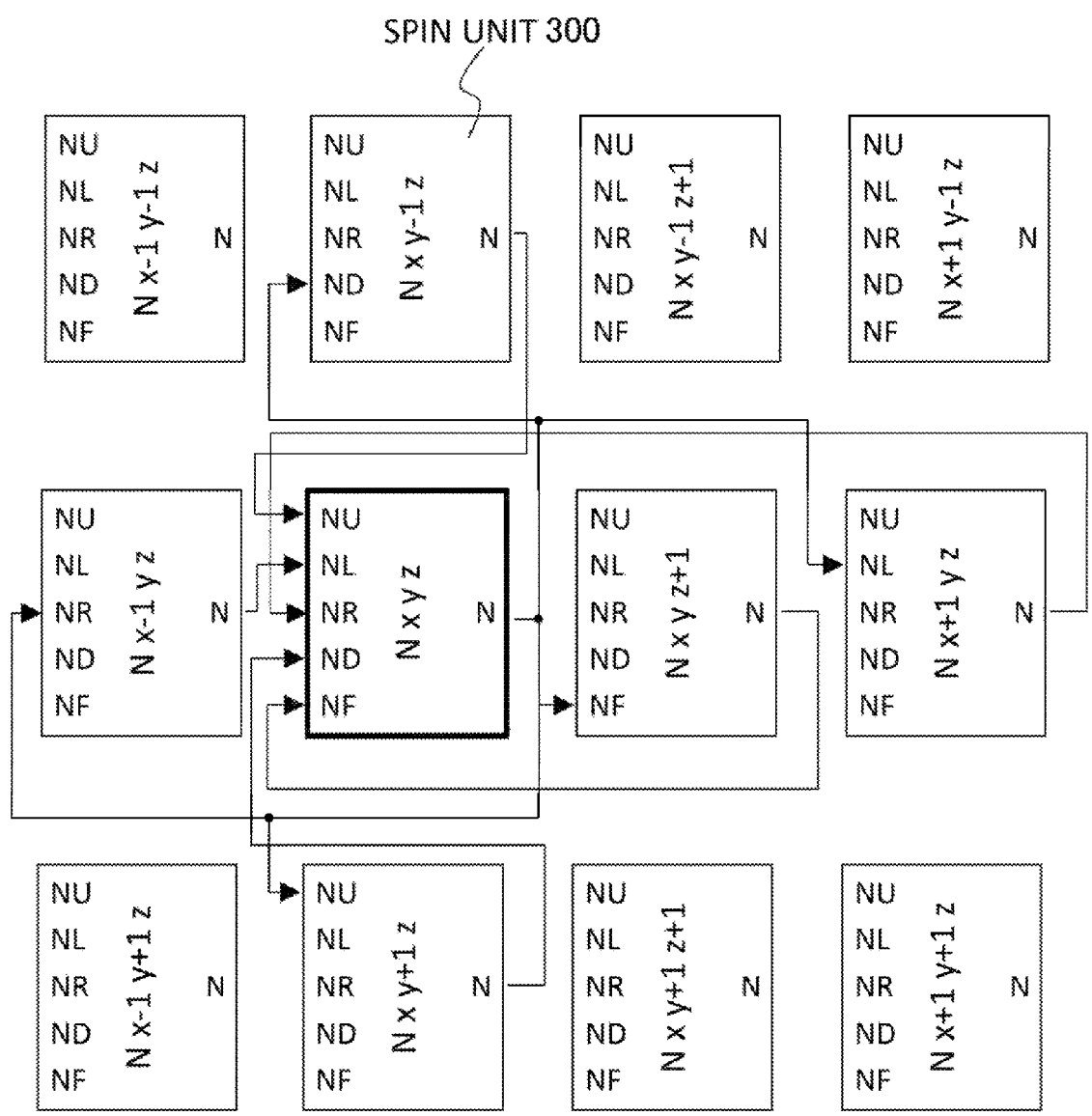
FIG. 9 is a diagram of exemplary interconnections to perform interactions between spin units.

For the interfaces EN, NU, NL, NR, ND, NF, and N of the spin unit 300 illustrated in FIG. 3, the interconnection of EN is as described in FIG. 10. FIG. 9 is examples of the interconnections of NU, NL, NR, ND, NF, and N. FIG. 9 is interconnections necessary to implement the topology as illustrated in FIG. 5 on the spin units disposed as illustrated in FIG. 8 when attention is focused on a single spin unit Nxyz. These interconnections are provided for the individual spin units, so that the topology in FIG. 5 can be implemented.

(10) A Scheme for Avoiding a Local Optimal Solution in a Search for the Ground State of an Ising Model It is possible to implement a search for the ground state of the Ising model to which energy minimization by the interaction between spins is applied as described above. However, it is possible that using only this scheme causes a local optimal solution. Basically, since there is only motion in the direction in which energy is decreased, once the process is trapped into a local optimal solution, the process is not enabled to escape from the local optimal solution, and a global optimal solution is not reached. Therefore, for the action to escape from a local optimal solution, as illustrated in FIG. 3, an inverted logic 314 is provided in the spin unit 300, and the spin array is changed randomly. The inverted logic 314 inverts the value of the subsequent spin calculated at the circuit (the interaction circuit) 303 that determines the subsequent state of the spin using inputs of random pulse trains VAR1 and VAR2.

Figure 11:
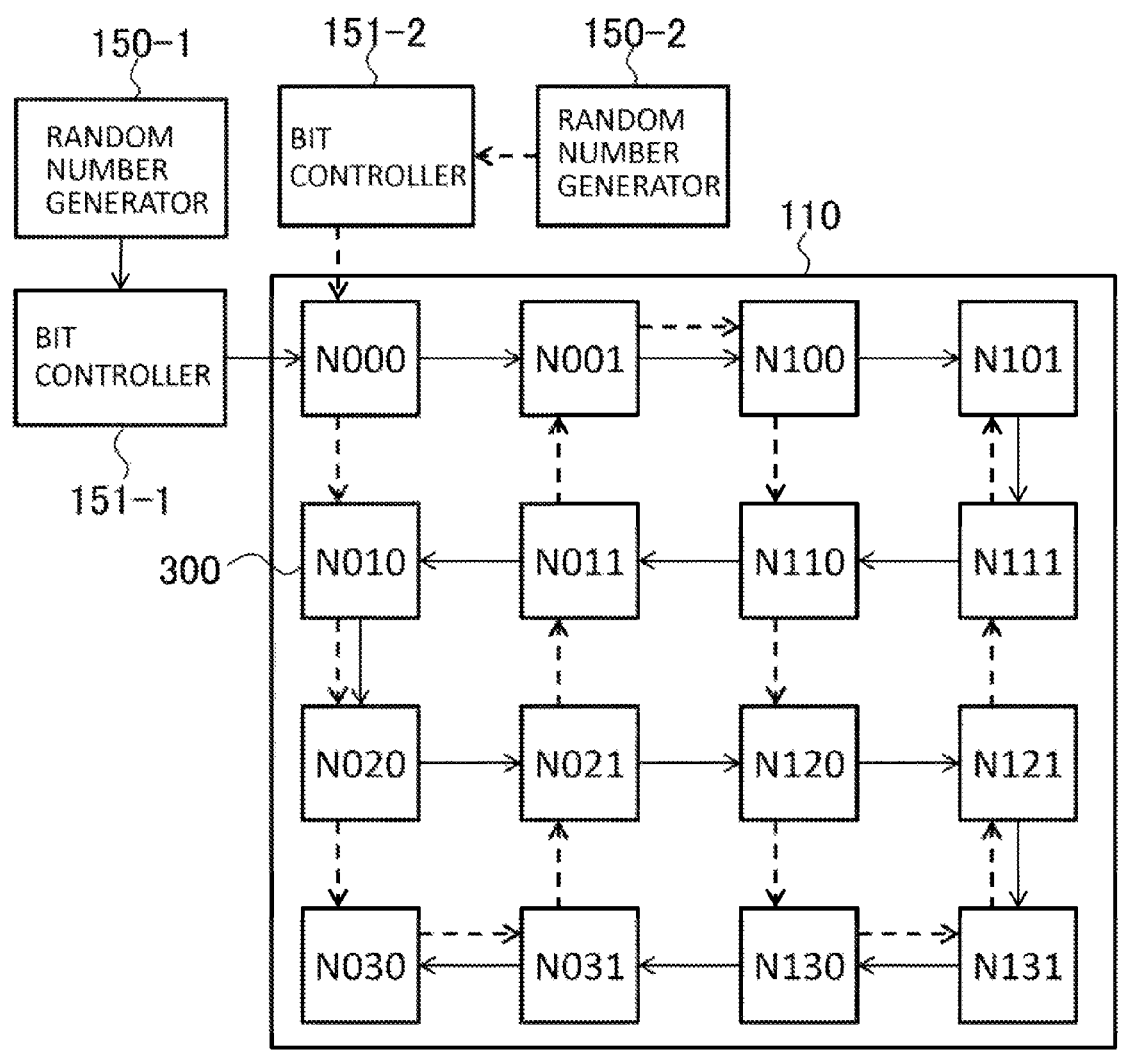
FIG. 11 is a diagram of the configuration of the spin array as attention is focused on propagation paths of a random pulse train.

In the present embodiment, as illustrated in FIG. 11, the random pulse trains are generated using two random number generators 150-1 and 150-2 and two bit controllers 151-1 and 151-2 at a time interval of the width of the random number clock 160. The random pulse train outputted from the random number generator 150-1 and the bit controller 151-1 is inputted to the spin unit N000, and outputted in the right direction. In the entire chip, the random pulse train is propagated along a path drawn with a single stroke depicted by solid arrows. On the other hand, the random pulse train outputted from the random number generator 150-2 and the bit controller 151-2 is inputted to the spin unit N00, and outputted in the downward direction. In the entire chip, the random pulse train is propagated along a path drawn with a single stroke depicted by broken arrows. In other words, the spin units are configured in which two different random pulse trains are inputted.

Two different random pulse trains VAR1 and VAR2 are propagated through the spin unit in FIG. 3 through random pulse train lines 311 and 312, temporally stored on buffers 315 and 316, and then outputted to the subsequent adjacent spin unit.

When two different random pulse trains VAR1 and VAR2 are inputted to an AND gate 313 and the values of the two random pulse train at this time is "1", the inverted logic 314 inverts the spin value of the output of the circuit 303 that determines the subsequent state of the spin. The inverted logic 314 causes the value of the spin to change in the direction in which local energy is increased, so that it is possible to escape from the local solution.

Figure 12:
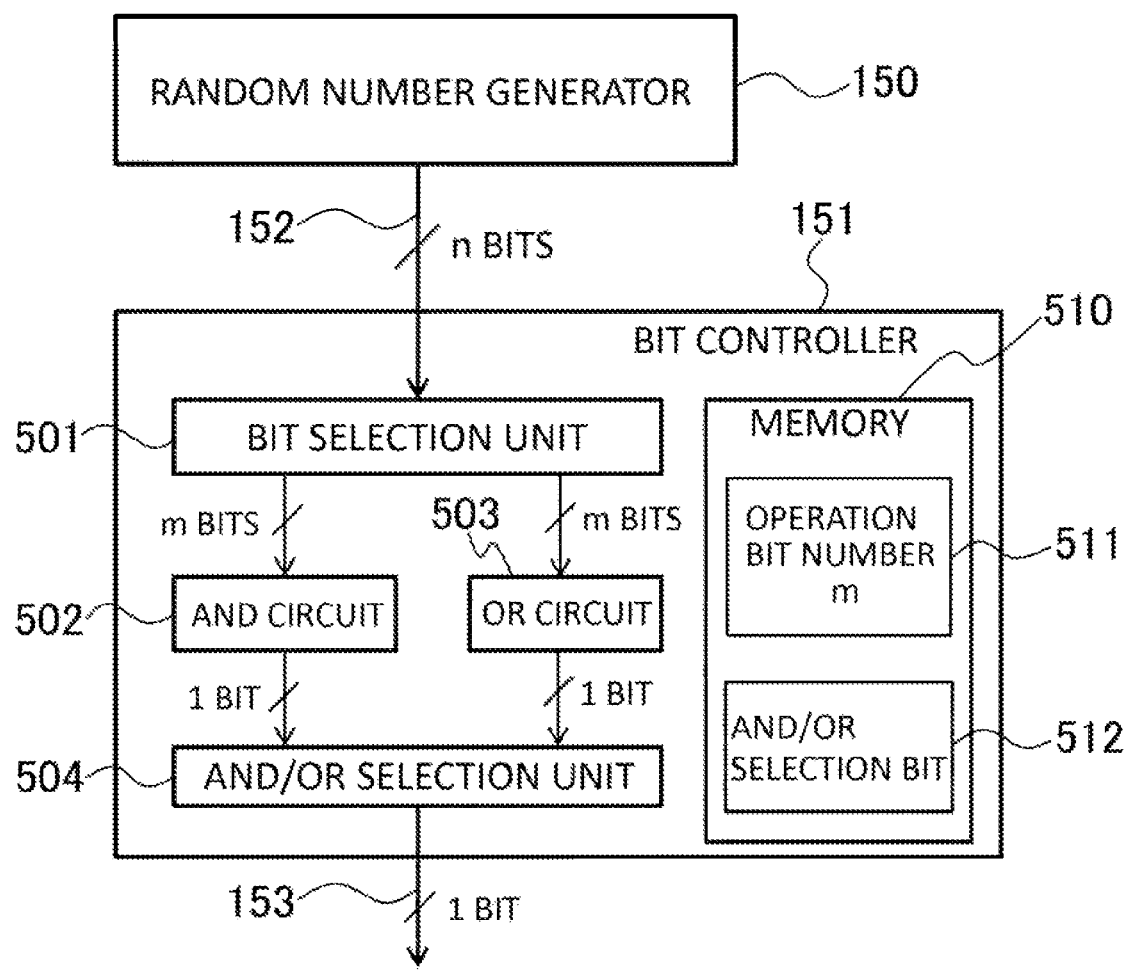
FIG. 12 is a diagram of the configuration of a bit controller.

FIG. 12 is the configuration of the bit controller 151. The random number generator 150 outputs the random number 152 in n bit width with no bias. Here, the term "no bias" means that when a sufficiently large number of random numbers are generated, the probability of occurrence is equal between "0" and "1" for the bits of the generated random numbers.

The bit controller 151 includes a bit selection unit 501, an AND circuit 502, an OR circuit 503, an AND/OR selection unit 504, and a memory 510. The memory 510 stores an operation bit number 511 and an AND/OR selection bit 512. The bit controller 151 receives n bits of a random number generated at the random number generator 150, and inputs the random number to the bit selection unit 501. The bit selection unit 501 extracts m bits expressed by the operation bit number 511 from n bits of the inputted random number, and inputs m bits to the AND circuit 502 and the OR circuit 503. The AND circuit 502 takes the AND of the bits of the values of the inputted m bits, and outputs the value of one bit obtained as a result. Similarly, the OR circuit 503 also takes the OR of the bits of the values of m bits, and outputs the value of one bit obtained as a result. The AND/OR selection unit 504 selects any one of the output of the AND circuit 502 or the output of the OR circuit 503 based on the value of the AND/OR selection bit 512, and sets the selected one to the output 153 of the entire bit controller 151.

The bit controller 151 can control the probability that "1" appears in the output bit string by changing the value of the operation bit number 511 and the value of the AND/OR selection bit 512. It is noted that in the following, the probability that "1" appears in the bit string is simply referred to as bit probability. The bit probability outputted from the bit controller 151 is given by Expression 2 and Expression 3 below.

[Expression 2]

$$P=2^{-m} \quad \text{(Expression 2)}$$

[Expression 3]

$$P=1-2^{-m} \quad \text{(Expression 3)}$$

In Expression 2 and Expression 3, P expresses the bit probability, and m expresses a bit number targeted for an arithmetic operation. Expression 2 expresses the bit probability in the case where an AND arithmetic operation is selected. Expression 3 expresses the bit probability in the case where an OR operation is selected.

(11) Expand the Ranges of the Interaction Coefficient and the External Magnetic Field Coefficient The spin unit 300 of the Ising chip 100 described above stores three values, +1, 0, and −1 for the external magnetic field coefficient and the interaction coefficients. When the ranges of the coefficients are limited to three values, events that the Ising model can express are limited. Thus, in order to allow the Ising model to be applicable to various problems, it is desired to expand the ranges of the coefficients to be more multivalued.

Figure 14:
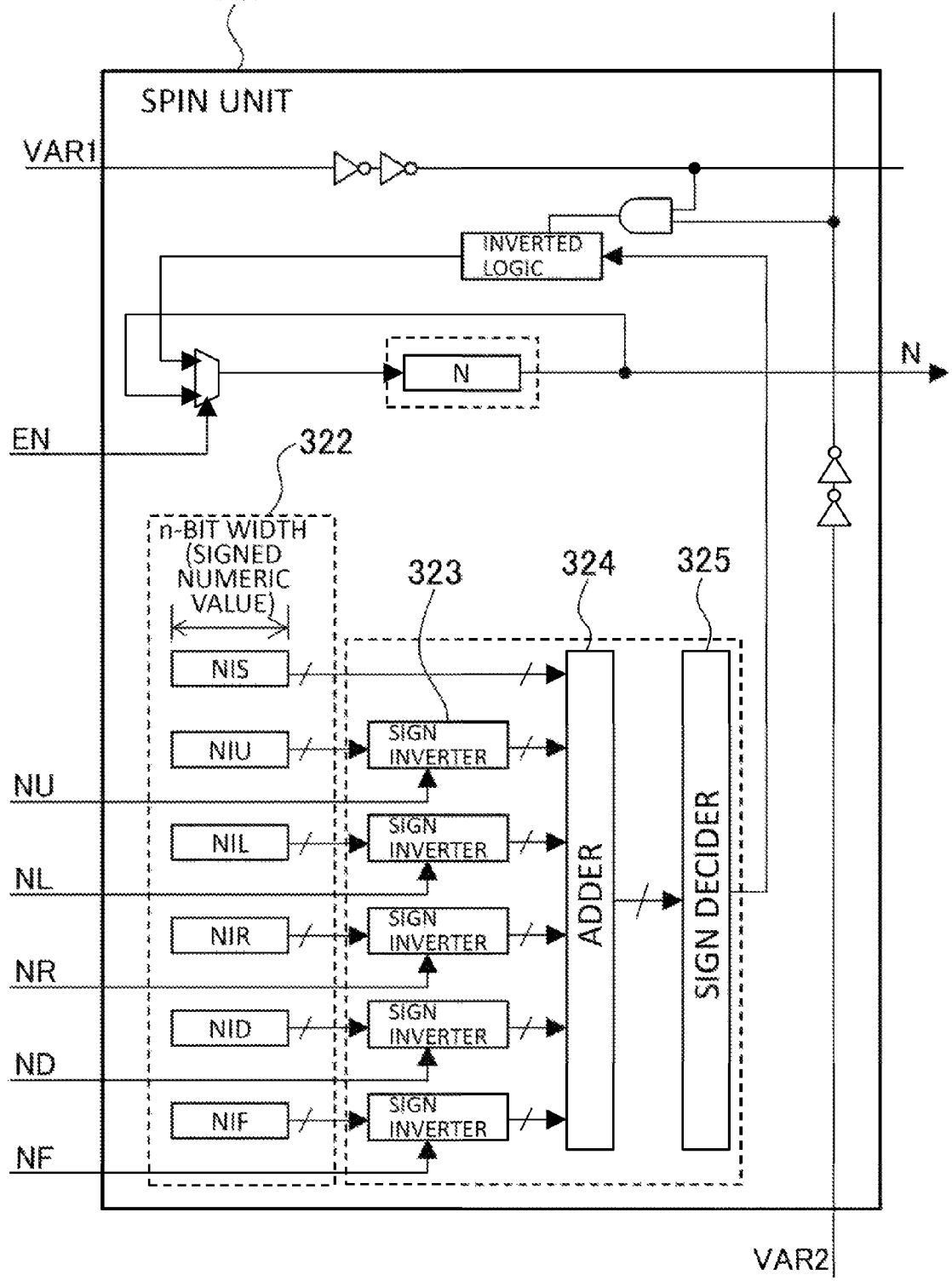
FIG. 14 is a diagram of an example of a spin unit mined with a function meeting multivalued coefficients.

As an example of a spin unit 320 that is simply mounted with a unit for the multivalued coefficient, FIG. 14 is an example including memory cells NIS, NIU, NIL, NIR, NID, and NIF (322) that store the coefficients of 2's complement notation in n-bit width (a signed numeric value) instead of the one-bit memory cells IS0, IS1, IU0, IU1, IL0, IL1, IR0, IR1, ID0, ID1, TF0, and IF1 (302) included in the spin unit 300 in FIG. 3. In order that these multivalued coefficients are read as they are and the products of the spin values NU, NL, NR, ND, and NF (two values) of the adjacent spin unit 320 and the coefficients are calculated, it is necessary to include sign inverters 323, an adder 324 that adds multiple values outputted from the sign inverters 323, and a sign decider 325 that determines the sign of a multiple value outputted from the adder 324. However, the circuit scale of the sign inverter 323, the adder 324, and the sign decider 325 is increased considerably according to the multivalued coefficient, and they are not suited to practical use.

Figure 16:
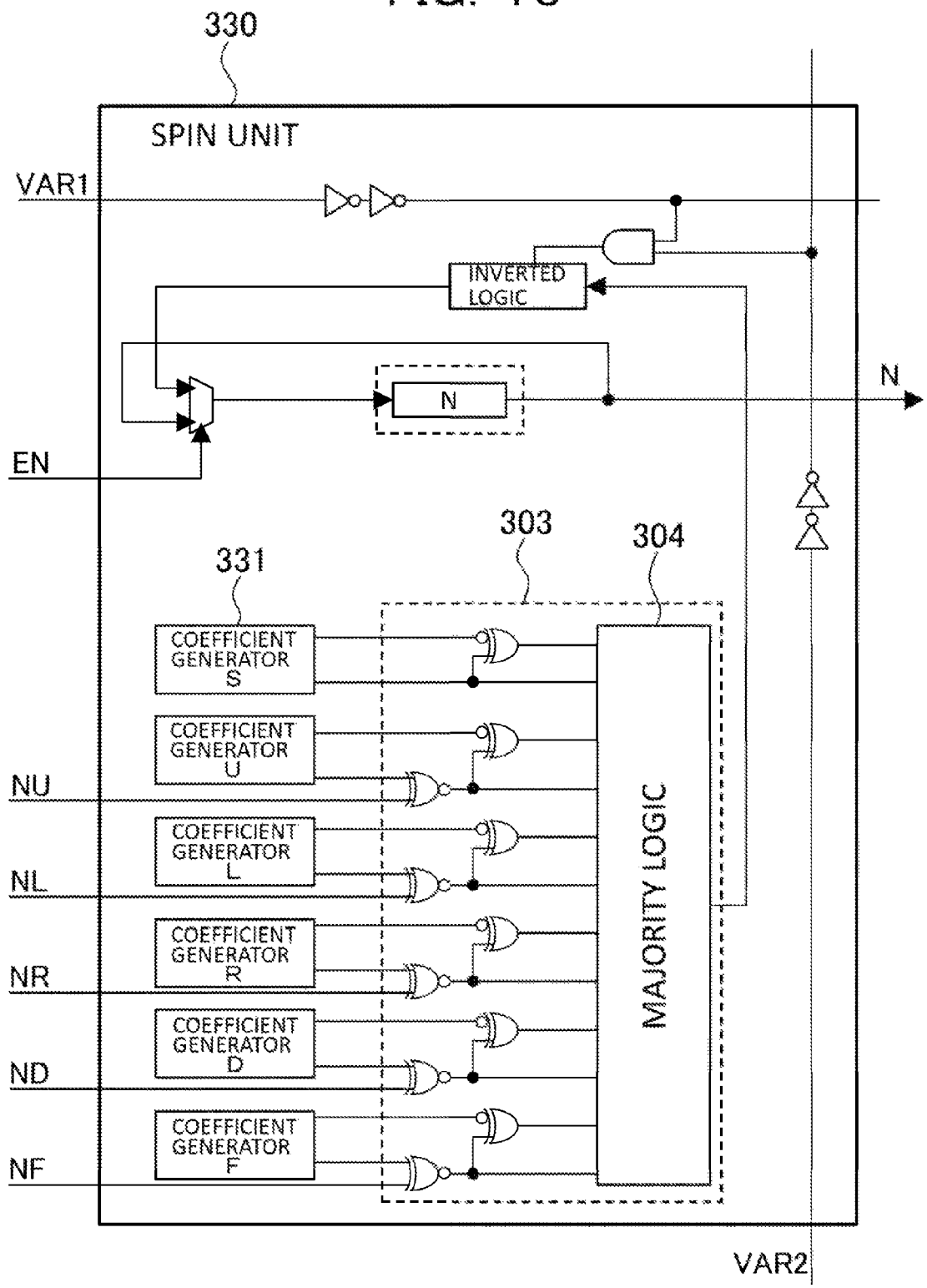
FIG. 16 is a diagram of a concept of a method for implementing a spin unit that processes a multivalued coefficient using hardware according to a first embodiment.

Therefore, the concept of a method for implementing a spin unit 330 that handles the multivalued coefficient in the present embodiment using hardware is that as illustrated in FIG. 16, the circuit 303 in FIG. 3 that determines the subsequent state of the spin is followed as it is (since the circuit scale can be suppressed in a small scale in the circuit configuration in which the majority logic is combined with the XOR circuit to perform an interaction, this frame is basically left), and the spin unit 330 is configured to include a coefficient generator 331 that simulates three coefficient values, +1, 0, and −1 at the probability according to the size of the multivalued coefficient held in the memory cells NIS, NIU, NIL, NIR, NID, and NIF in the inside of the spin unit 330 and outputs coefficients in a time series.

In other words, a given range of coefficients is stored in advance in the coefficient generator 331 (in the following, referred to as a given range coefficient), a random number is generated inside, the absolute value of a given range coefficient is compared with the size of a random number, the positive multivalued coefficient is simulated by +1/0, a negative multivalued coefficient is simulated by −1/0, and three coefficient values, +1, 0, and −1, are outputted in a time series. Alternatively, regardless of positive and negative coefficients, a combination of two coefficient values +1 and −1 in a time series is outputted. In any of the cases, a given range coefficient is implemented in a pseudo manner by matching the size of the expected values of coefficients generated in a time series with the size of a given range coefficient.

The coefficient generator 331 generates the subsequent coefficient value in the midway point of a single interaction in the ground state search process for the Ising model inside of the Ising chip 100 and outputs the value. Similarly in the spin unit 300 in FIG. 3, the outputted coefficients of three values are subjected to the interaction process, and the subsequent state of the spin is determined.

The method for implementing the coefficient generator 331 described above or a method for forming a circuit having the equivalent function can be thought in multiple ways.

(12) Implement the Coefficient Generator Using the Random Number Generator

Figure 17:
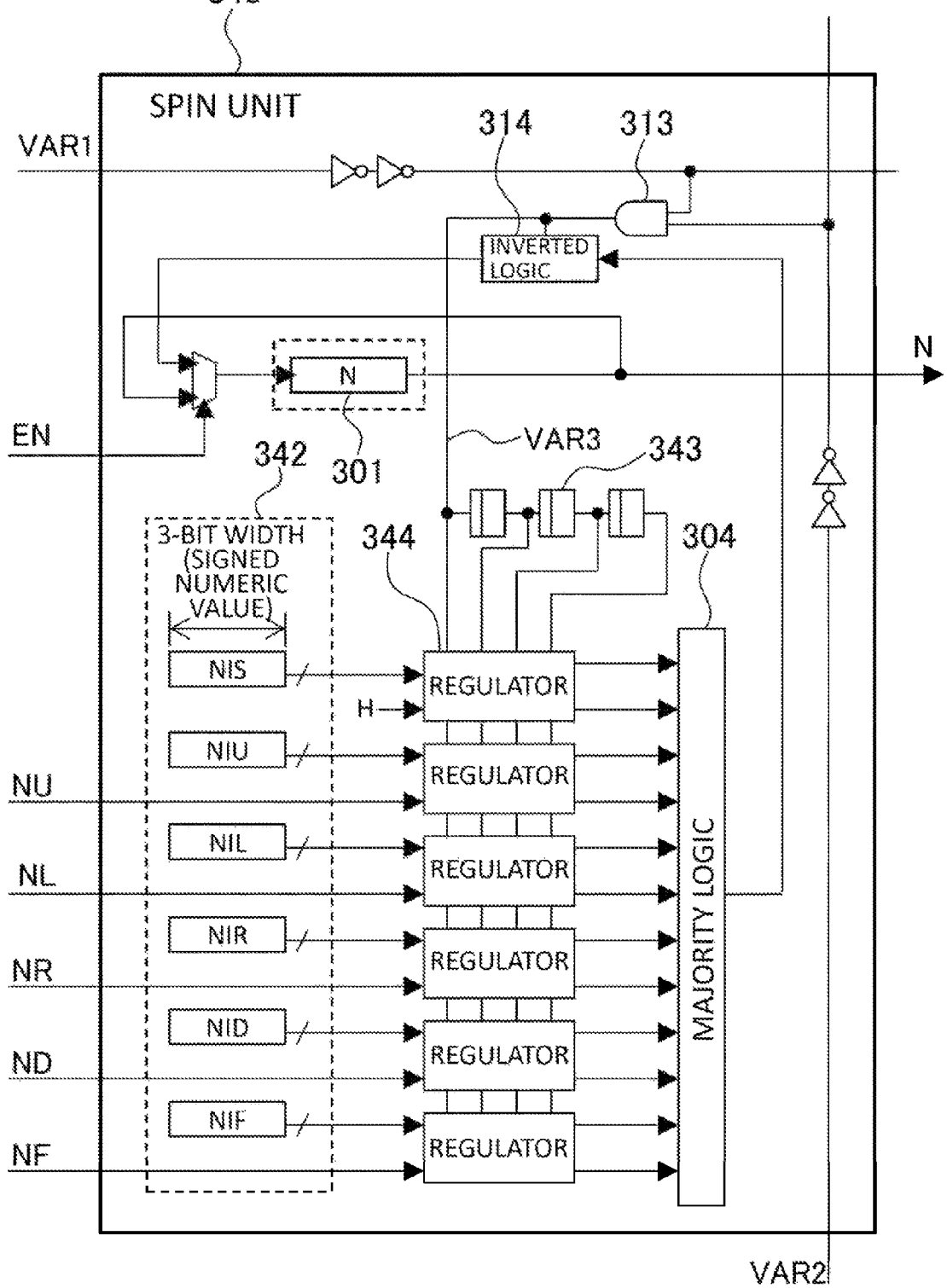
FIG. 17 is a diagram of an example in which a coefficient generator is implemented using a random number generator.

FIG. 17 is an exemplary configuration that implements the coefficient generator using a random pulse train VAR3 that is outputted from the AND gate 313 through the random pulse trains VAR1 and VAR2 generated from the random number generators 150-1 and 150-2 and the bit controllers 151-1 and 151-2 and inputted to the AND gate 313.

Similarly in an example of implementation illustrated in FIG. 14, the multivalued coefficients are in advance stored on memory cells NIS, NIU, NIL, NIR, NID, and NIF (342) that store the coefficients of 2's complement notation in n-bit width (a signed numeric value).

Here, for a method for implementing the memory cell group holding coefficients in n-bit width, the following can be thought as illustrated in FIG. 15. (1) A method for expanding bits to be arranged in the array direction of the word lines. (2) A method for expanding bits to be arranged in the array direction of the bit lines. Either method may be adopted.

The internal configuration of a spin unit 340 illustrated in FIG. 17 is in which a regulator 344 is disposed individually for the external magnetic field coefficient and the interaction coefficients. The regulator 344 receives a coefficient in three-bit width for example of a coefficient in n-bit width (a signed numeric value), at the same time receives the value of the spin from the adjacent spin unit, calculates the product of the interaction coefficient and the adjacent spin or the external magnetic field coefficient in the same specification as the process of the interaction circuit 303 in FIG. 3, and outputs a two-bit signal in the same specification as the two-bit signal inputted to the majority logic circuit 304. A predetermined "H" signal is inputted to the input of the regulator for the external magnetic field coefficient instead of the adjacent spin. This is because it can be interpreted that the external magnetic field coefficient is equivalent to the interaction with the spin whose value is always +1 (in the spin unit, it is expressed as an "H" signal).

Moreover, the random pulse train VAR3 outputted from the AND gate 313 is delayed at a flip-flop 343 to process a random number in four-bit width, and the processed random number is inputted to the regulators.

Figure 18:
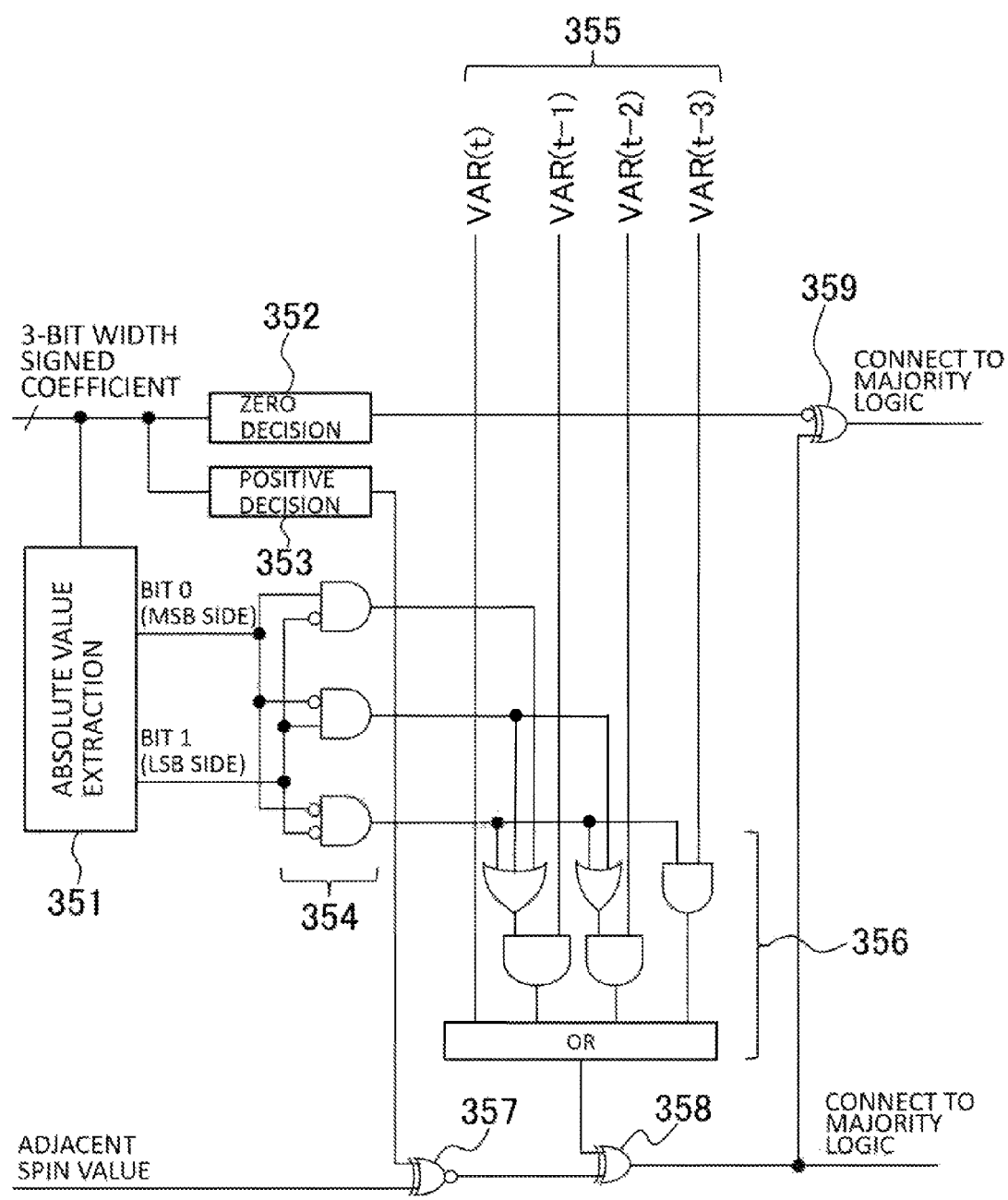
FIG. 18 is a diagram of a first exemplary configuration of a regulator that produces a combination of simulated coefficient values +1 and −1 in a time series according to the size of the absolute value of a multivalued coefficient.

FIG. 18 is a first exemplary configuration of the regulator 344. The regulator in FIG. 18 receives a signed coefficient in three-bit width, and outputs a combination of the coefficients +1 and −1 in a time series. It is noted that zero is outputted only when the coefficient in three-bit width is zero. An absolute value extraction circuit 351 extracts the absolute values equivalent to coefficients +3 to −3 from the signed coefficient in three-bit width based on the coefficients of 2's complement notation. Originally, although 2's complement notation of the signal in three-bit width can express coefficients +3 to −4, positive and negative ranges line up with each other for simplicity. In other words, an assumption is provided that the absolute value of the maximum positive number is the same as the absolute value of the minimum negative number. The absolute values of the coefficients are allocated to three bit lines using three AND circuits 354, and a circuit 356 that compares the sizes with a random number 355 in four-bit width. It can be thought that the AND circuit 354 is a kind of decoder that outputs 1 according to the size of the absolute value.

The comparator 356 aims to generate a combination of simulated coefficient values +1 and −1 in a time series according to the size of the absolute value of a multivalued coefficient. Simulated coefficient values in a time series can be generated in combinations. For example, in the case of the coefficient +3, simulated coefficient values in a time series can be generated as +1, +1, and +1. In the case of the coefficient +2, simulated coefficient values in a time series can be generated as combinations of +1, 0, +1 (in the case of simulation using combinations of +1 and 0) or as combinations of +1, −1, and +1 (in the case of simulation using combinations of +1 and −1). In the case of the coefficient −2, simulated coefficient values in a time series can be generated as combinations of −1, 0, and −1 (in the case of simulation using combinations of −1 and 0) or as combinations of +1, −1, and −1 (in the case of simulation using combinations of +1 and −1).

To this end, the comparator 356 is configured in which the output of a four-input one-output OR circuit in the lower part more easily takes 1 as the absolute value of the coefficient is smaller. The comparator 356 is operated in such a manner in which the value 1 of the random numbers VAR(t−1), VAR(t−2), and VAR(t−3) in four-bit width more easily reaches the four-input one-output OR circuit in the lower part as the absolute value of the coefficient is smaller. In other words, the comparator 356 masks the values of the random numbers VAR(t−1), VAR(t−2), and VAR(t−3), and the value 1 of the random number is passed with no mask as the absolute value of the coefficient is smaller.

In the case where the input of the signed coefficient in three-bit width has a positive coefficient, one is outputted, whereas in the case where the input has the other coefficients, zero is outputted by a positive decision circuit 353. Moreover, in the case where the coefficient is zero, zero is outputted, whereas in the case of the other coefficients, one is outputted by a zero decision circuit 352.

An XNOR circuit 357 that receives the output of the positive decision circuit and the value of the adjacent spin, an XOR circuit 358 that receives the output of the comparator 356 and the output of the XNOR circuit 357, and an XOR circuit 359 that receives the output of the XOR circuit 358 and the output of the zero decision circuit 352 are included, and the simulated coefficient +1 or −1 is generated from the multivalued signed coefficient at the two-bit output of the regulator 344, and the product of the simulated coefficient and the value of the adjacent spin is outputted. In other words, a two-bit signal in the same specification as the two-bit signal inputted to the majority logic circuit 304 in the interaction circuit 303 in FIG. 3 using the coefficients of three values is outputted to the majority logic circuit 304.

In the regulator 344 according to the present embodiment, an example is described in which the signed coefficient in three-bit width is received and the interaction with the value of the adjacent spin is processed. However, for example, in the case where a signed coefficient in n-bit width (a signed integer) is received, the bit of the absolute value of the output of the absolute value extraction circuit 351, for example, is (n−1), and the number of the AND circuits 354 split from the output is (n−1)^2−1, and the comparator 356 compares the absolute value of the coefficient with a random number in (n−1)^two bits width on (n−1)^2−1 bit lines.

Figure 19:
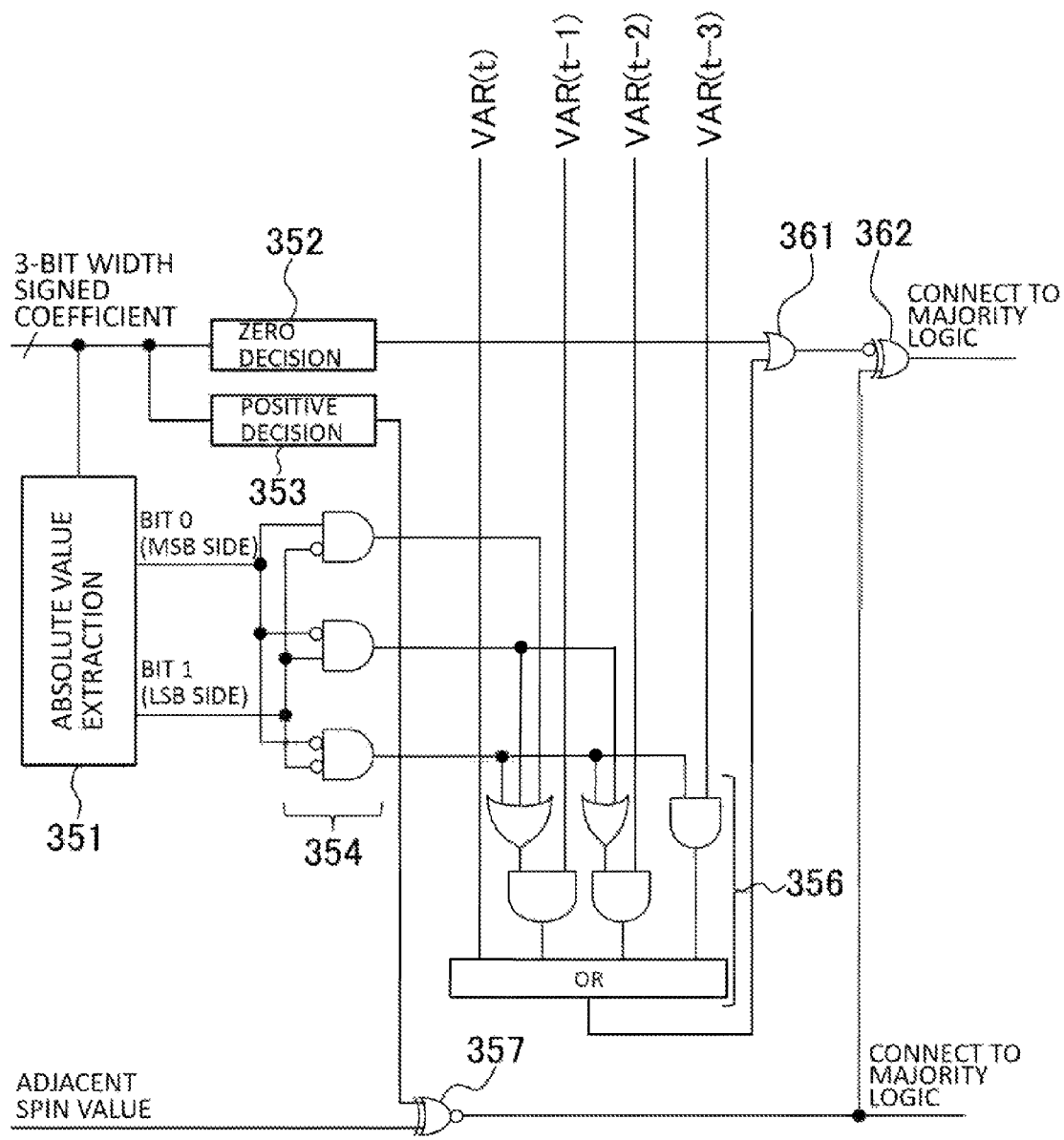
FIG. 19 is a diagram of a second exemplary configuration of a regulator that generates simulated coefficients +1 and 0 in the case where a multivalued signed coefficient is a positive number and generates simulated coefficients −1 and 0 in the case where a multivalued signed coefficient is a negative number.

FIG. 19 is a second exemplary configuration of the regulator 344. The difference from the first exemplary configuration illustrated in FIG. 18 is in that the second exemplary configuration includes a configuration in which the output of the comparator 336 is inputted to an OR circuit 361 together with the output of the zero decision circuit 352 and the output of the OR circuit 361 is inputted to an XOR circuit 362 together with the output of the XNOR circuit 357.

In the second configuration of the regulator, in the case where the multivalued signed coefficient is a positive number, the simulated coefficient +1 or 0 is generated by the comparison with the random number, and the product of the coefficient and the value of the adjacent spin is outputted. In the case where the multivalued signed coefficient is a negative number, the simulated coefficient −1 or 0 is generated by the comparison with the random number, and the product of the coefficient and the value of the adjacent spin is outputted. In other words, a two-bit signal in the same specification as the two-bit signal inputted to the majority logic circuit 304 in the interaction circuit 303 in FIG. 3 using the coefficients of three values is outputted to the majority logic circuit 304.

Figure 20:
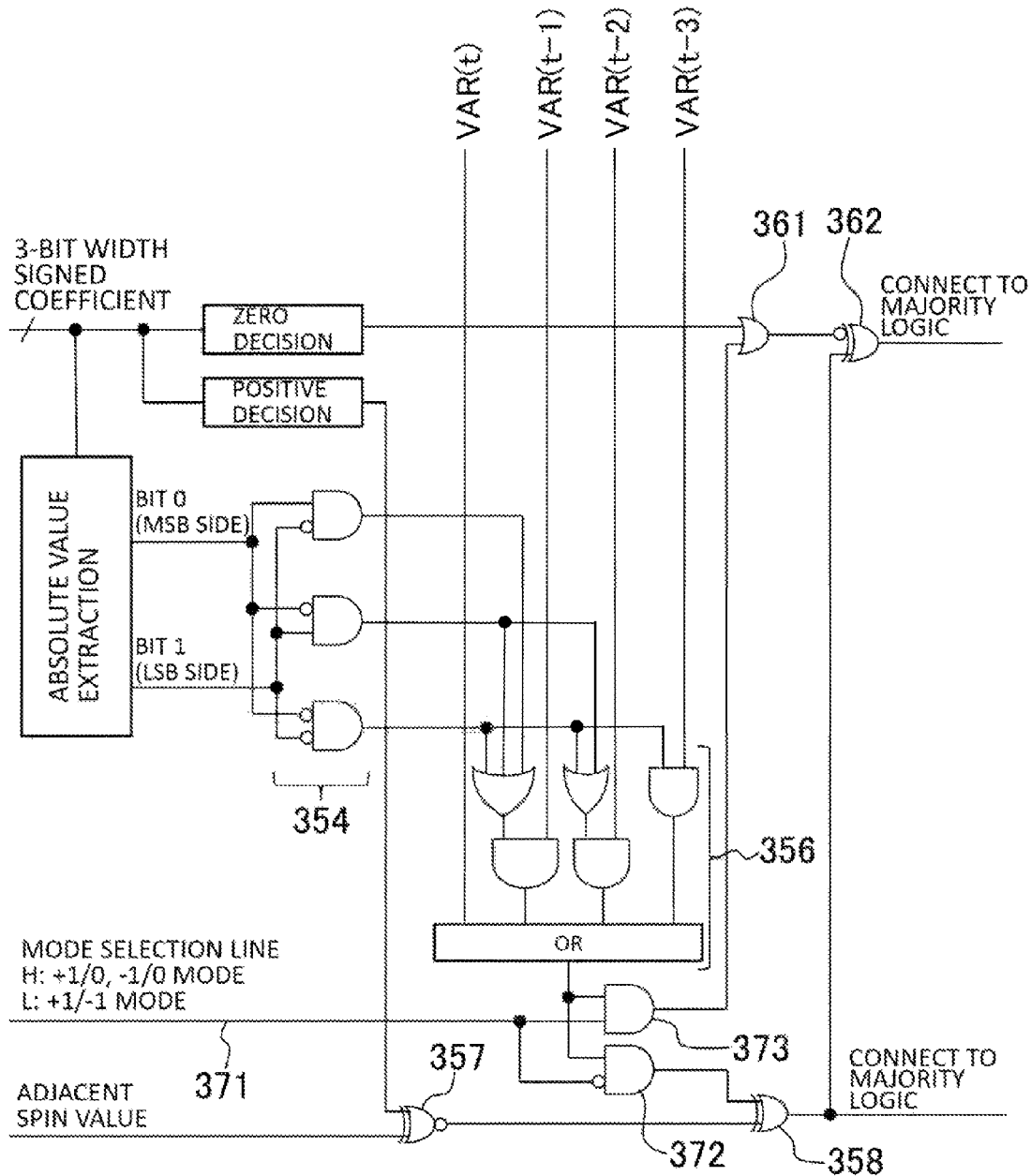
FIG. 20 is a diagram of a third regulator including the functions of both of a first regulator and a second regulator.

A third exemplary configuration of the regulator 344 illustrated in FIG. 20 is an example that the regulator 344 has the functions of the first regulator in FIG. 18 and the second regulator in FIG. 19 in which a mode selection line 371 is provided to receive a select signal and the connection is switched using two AND circuits 372 and 373.

Figure 21:
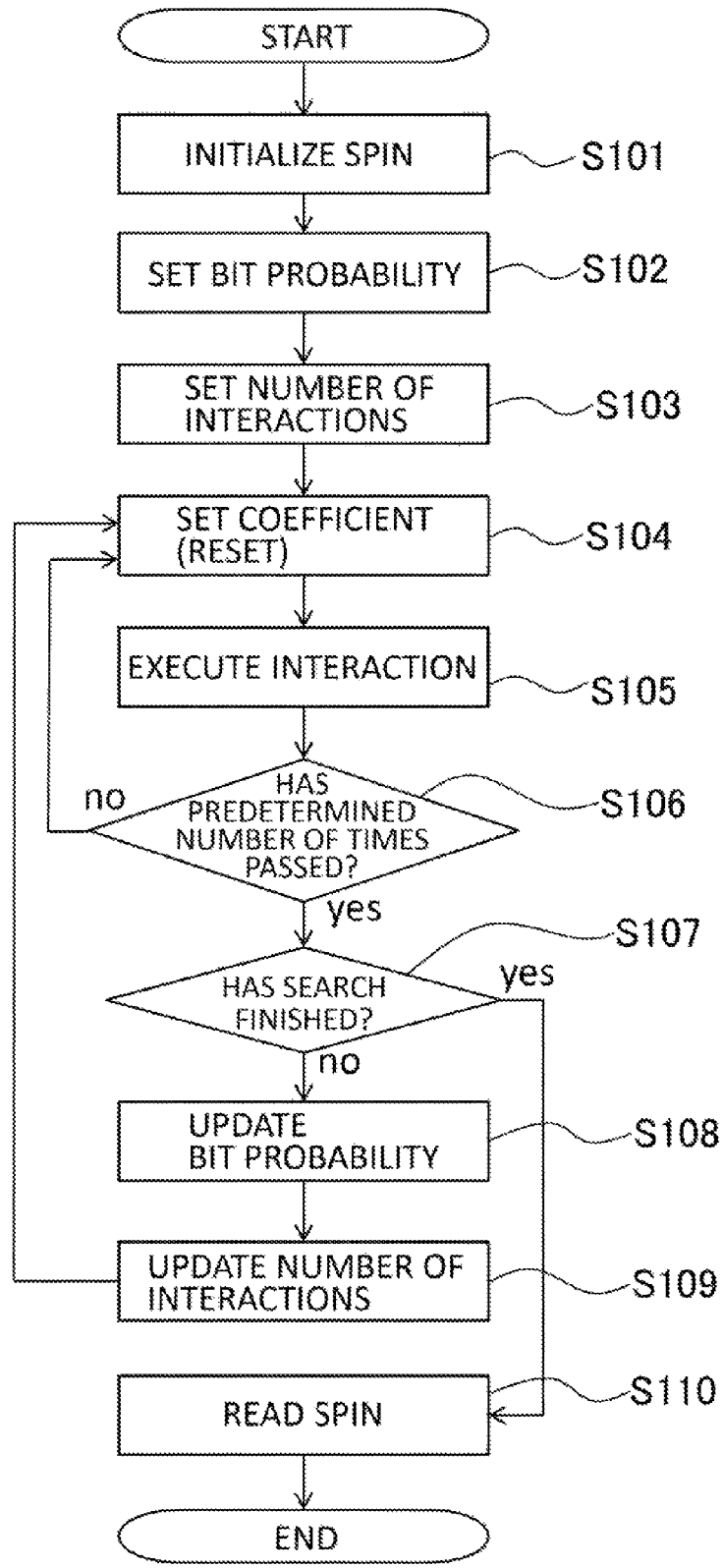
FIG. 21 is a diagram of an exemplary flowchart of solving an optimization problem using an Ising chip including a spin unit that stores a multivalued coefficient and generates simulated coefficient using random numbers.

FIG. 21 is an exemplary flowchart of solving an optimization problem using the Ising chip 100 including the spin unit 340 that stores the multivalued coefficients illustrated in FIG. 17 and generates a simulated coefficient using a random number. This flowchart is executed on the information processor 200 illustrated in FIG. 2.

Prior to the execution of the flowchart, the CPU 210 executes the problem transformation program 221, and transforms an optimization problem desired to solve into an Ising model. The CPU 210 writes interaction coefficients and an external magnetic field coefficient thus obtained to the memory cells 342 (NIS, NIU, NIL, NIR, NID, and NIF) of all the spin units 340 of the Ising chip 100 using the Ising chip control program 222.

The CPU 210 executes the Ising chip control program 222 to implement the steps of the flowchart.

In Step S101, the value of the spin N of the spin units 340 is set. For the value of the spin, a random value is written, for example. Alternatively, a predetermined value may be written.

In Step S102, the Ising chip control program 222 sets the initial value of the bit probability of the random number bit outputted from the bit controller 151 (the operation bit number 511 and the AND/O selection bit 512 are stored on the memory 510 in such a manner that the initial value has a high value of bit probability), and the set value is reflected on the bit controller 151 in the Ising chip.

In Step S103, the Ising chip control program 222 sets the number of times to continue interactions in the setting of the present bit probability (see a table in FIG. 13, for example). This is supplied as an address, the interactive address 180, to identify a group that performs interactions.

In Step S104, in synchronization with the interactive clock 181 and the input of the enable signal EN from the interactive address decoder 140, the multivalued coefficient is read out of the memory cell 342, and simulated coefficients (+1, 0, −1) are generated at the probability according to the size of the multivalued coefficient in the regulator 344. The process is performed in which the random pulse trains VAR1 and VAR2 generated using the random number generators 150-1 and 150-2 and the bit controllers 151-1 and 151-2 at a time interval of the width of the random number clock 160 are inputted to the AND circuit 313 to generate the random pulse train VAR3, and the random pulse train VAR3 and a random number in four-bit width delayed at the flip-flop 343 are inputted.

In Step S105, the interactive address decoder 140 identifies the group specified to the interactive address 180 to perform interactions, and issues the enable signal EN to the spin units 340 belonging to the group in synchronization with the interactive clock 181 for interactions. In other words, the regulators 344 in the spin unit 340 operates the product of the simulated coefficient generated from the multivalued coefficient and the value of the adjacent spin, and the outputs of all the regulator 344 are inputted to the majority logic circuit 304 to determine the value of the subsequent state of the spin.

The output of the majority logic circuit 304 is stored on the memory cell 301 that stores the value of the spin. In the midway point, the output is passed through the inverted logic 314 as a unit to avoid a local optimal solution in a ground state search for the Ising model. The inverted logic 314 inverts the inputted value of the spin in the case where the output of the inputted AND circuit 313 is "1" to which the random pulse trains VAR1 and VAR2 are inputted.

The value of the subsequent state of the spin is updated on the memory cell 301, and the execution of one interaction is finished. The Ising chip control program 222 increments the number of times of interactions.

In Step S106, the Ising chip control program 222 determines whether interactions are performed for the number of times of interactions set in Step S103 or S109 (the address number specified by the interactive address). When interactions are not performed the set number of times, the process returns to Step S104, and the processes in Step S104 and S05 are repeated, whereas when interactions are performed the set number of times, the process goes to Step S107.

In Step S107, the Ising chip control program 222 determines whether the setting of the present bit probability for the random number bit outputted from the bit controller 151 is below the finish threshold (which is a final lower limit of bit probability that interactions are in turn performed the set number of times illustrated in FIG. 13, for example, while decreasing bit probability and the spin array is considered to reach a global optimal solution within an allowable error). When the number of times is below the finish threshold, the process goes to Step S110, otherwise the process goes to Step S108.

In Step S108, the Ising chip control program 222 updates the value of bit probability to a value lower than the present value, selects the set values of the operation bit number 511 and the AND/OR selection bit 512 of the bit controller 151 that generates the random pulse train of the updated bit probability (for example, the data table illustrated in FIG. 13 is prepared), and reflects new set values on the bit controller 151 in the Ising chip.

In Step S109, the Ising chip control program 222 sets the number of times to continue interactions at the updated bit probability. Moreover, the Ising chip control program 222 rests the number of times of interactions to zero. It is noted that the number of times to continue interactions set here may be the same as the number of times to continue interactions set in Step S103, or may be increased or decreased as necessary. After the process in Step S109 is finished, the process returns to Step S104.

In Step S110, the Ising chip control program 222 reads the value of the spin array out of the Ising chip 100, and the flowchart in FIG. 21 is ended. After that, for example, the information processor 200 transforms the value of the spin array read by the problem transformation program 221 into the solution of the optimization problem desired to solve, and presents the solution to a user.

FIG. 13 is an example of the bit probability and the number of times to continue interactions in turn changed and set in performing a search for the ground state of the Ising model according to the flowchart in FIG. 21. Immediately after starting a search, an OR operation is first used to set a high bit probability. Thus, since the value of the spin is frequently inverted, a local solution can be easily avoided. As the search goes, the bit probability is gradually decreased, and a single solution is converged.

In setting the initial value of the bit probability in Step S102 in the flowchart in FIG. 21, as illustrated in the top row in the table in FIG. 13, for example, an OR operation is selected, and the bit number for the arithmetic operation is set to three bits. In this setting, interactions are performed 100 times. After that, in updating the bit probability and the number of interactions in Step S108 and Step S109, the set values go to the subsequent row in the table in FIG. 13. In other words, an OR operation is selected, the bit number for the arithmetic operation is set to two bits, and the number of interactions is set to 110 times. Similarly, every time the presses in Step S108 and Step S109 are performed, the set values go to the subsequent row in the table in FIG. 13, and the ground state search is ended when interactions are finished at the set values in the last row. As described above, the number of interactions is increased while decreasing the bit probability, so that a better solution can be easily obtained.

Every time interactions are performed in synchronization with the interactive clock 181 and the input of the enable signal EN from the interactive address decoder 140, the regulators 344 in the spin unit 340 illustrated in FIG. 17 read the multivalued coefficient stored in advance on the memory cell 342, compares the absolute value of the multivalued coefficient with the size of the random number 355 in four-bit width, and generates the simulated coefficients +4, 0, and −1. In other words, the coefficients are changed in a time series for interactions.

Here, as described above, the bit probability of the random pulse trains VAR1 and VAR2 outputted from the bit controller 151 is controlled to be gradually decreased. The bit probability of the random number 355 in four-bit width is also gradually decreased accordingly. As a result, when the bit probability is high, the influence of the size of the absolute value of the multivalued coefficient on the output of the comparator 356 is great, and the effect of inverting the product of the value of the adjacent spin and the simulated coefficient is also great. However, when the bit probability is gradually decreased, the influence of the size of the absolute value of the multivalued coefficient on the output of the comparator 356 becomes small, and the effect of inverting the product of the value of the adjacent spin and the simulated coefficient also becomes small. In other words, in the process in which the multivalued coefficient is changed to the simulated coefficients in a time series for interactions and a search for the ground state of the Ising model is performed, the solution of the spin string can be converged.

Second Embodiment

The coefficient generator 331 is proposed in FIG. 16 for an example of implementation, which is provided in the spin unit 330 of the Ising chip 100, in which interactions can be performed using a multivalued coefficient. In the first embodiment, the unit is described, which implements the coefficient generator using random numbers generated at the random number generator.

In the present embodiment, another implementing unit will be described.

Figure 22:
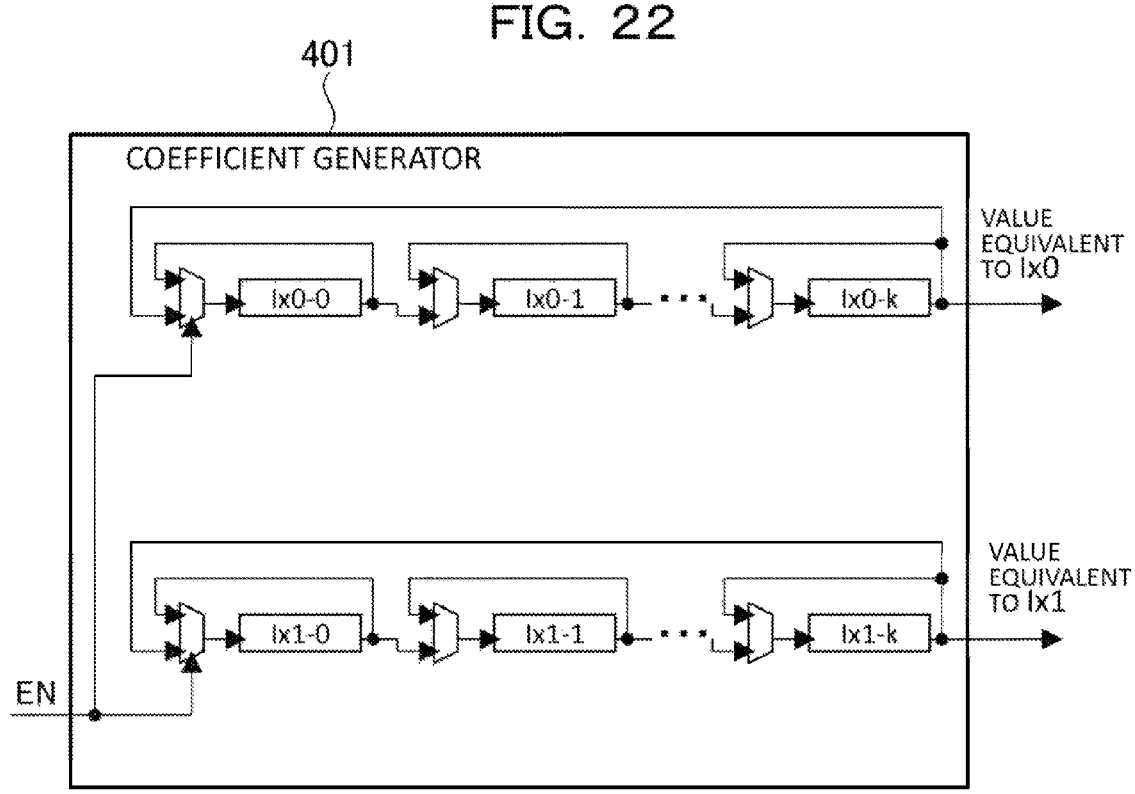
FIG. 22 is a diagram of an example of mounting a coefficient generator using shift registers.

A coefficient generator 401 illustrated in FIG. 22 performs the function of a coefficient generator 331 that generates the simulated coefficients +1, 0, and −1 in a time series from the multivalued coefficient on a computer in advance in simulation, records the generated simulated coefficient string, and downloads and stores the simulated coefficient string on shift registers formed in spin units 330 of an Ising chip 100.

The shift registers in the coefficient generator 401 are formed of shift registers in two lines equivalent to the specification in which coefficients are read out of two memory cells Ix0 and Ix1 that store the coefficients of three values illustrated in FIG. 3.

In synchronization with the input of an enable signal from an interactive address decoder, a pair of leading simulated coefficients is read out of the shift registers in two lines, and inputted to the interaction circuit 303 for interactions. The simulated coefficient string stored on the shift registers is shifted for every single interaction, and repeatedly used.

It is noted that from the viewpoint of a layout, it is easy to form a memory cell group configuring the shift register in the configuration (2) illustrated in FIG. 15 in which the memory cell group is expanded in the bit direction.

A coefficient generator 402 illustrated in FIG. 23 is configured in which the coefficient generator 402 performs the function of a coefficient generator 331 that generates the simulated coefficients +1, 0, and −1 in a time series from the multivalued coefficient on a computer in advance in simulation, records the generated simulated coefficient string, downloads and stores the simulated coefficient string on two groups of memory cells formed in a spin units 330 of an Ising chip 100, and selects and reads the simulated coefficients using a selector 403.

The selector selects a pair of simulated coefficients from two groups of memory cells Ix0-0 to Ix0-$k$ and Ix1-0 to Ix1-$k$ in the coefficient generator 402 as equivalent to the specification in which coefficients are read out of two memory cells Ix0 and Ix1 that store the coefficients of three values illustrated in FIG. 3.

In synchronization with the input of an enable signal from an interactive address decoder, a pair of simulated coefficients in the sequence stored on a counter 404 is read and inputted to an interaction circuit 303 for interactions. The simulated coefficient string stored on the memory cell groups is in turn selected by the counter 404, and repeatedly used.

It is noted that from the viewpoint of a layout, it is easy to form the two memory cell groups in the configuration (1) illustrated in FIG. 15 in which the two memory cell groups are expanded in the word direction.

What is claimed is:
1. A semiconductor device comprising:
   a plurality of spin units individually including:
      a memory cell configured to store a value of a single spin in an Ising model;
      a memory cell configured to store an interaction coefficient expressing an interaction from another spin to the single spin;
      a coefficient regulator configured to select one from a predetermined coefficient group at a probability proportional to a size of the interaction coefficient by comparing the interaction coefficient with a random number; and an arithmetic circuit configured to perform an arithmetic operation to determine a subsequent state of the spin according to the selected coefficient; and a random number generator configured to supply the random number to the plurality of the spin units.

2. The semiconductor device according to claim 1, wherein the random number supplied to the plurality of the spin units is a random pulse train.

3. The semiconductor device according to claim 2, wherein the interaction coefficient is a signed integer of three bits or greater.

4. The semiconductor device according to claim 1, wherein a product of the coefficient selected at the coefficient regulator and a value of an adjacent spin is computed and inputted to a majority logic circuit.

5. The semiconductor device according to claim 4, wherein the interaction coefficient is a signed integer of three bits or greater.

6. The semiconductor device according to claim 1, wherein the interaction coefficient is a signed integer of three bits or greater.

7. The semiconductor device according to claim 1, wherein the random number generator includes a bit controller configured to variably control a bit probability and output a random pulse train; and each time the spin unit performs the arithmetic operation a predetermined number of times, the bit controller in turn decreases a bit probability of a random pulse train to be outputted when an arithmetic operation is performed a subsequent predetermined number of times.

8. The semiconductor device according to claim 7, wherein one bit of a random pulse train outputted from the bit controller is supplied to the spin units; and a random number in width of a plurality of bits is generated by passing the random pulse train through a delay device in the spin units and is inputted to the coefficient regulator.

9. A semiconductor device comprising:
a plurality of spin units individually including:
    a memory cell configured to store values of spins in an Ising model;
    a memory cell configured to store an interaction coefficient from an adjacent spin that exerts an interaction on the spin;
    a memory cell configured to store an external magnetic field coefficient of the spin; and
    an interaction circuit configured to determine a subsequent state of the spin,
wherein the memory cell storing the interaction coefficient and the memory cell storing the external magnetic field coefficient are formed of a shift register that stores a simulated coefficient string generated in advance, shifts the stored simulated coefficient string, and in turn outputs a leading simulated coefficient in performing an interaction to determine a subsequent state of a spin of the spin units from a value of a spin from an adjacent spin unit, an interaction coefficient, and an external magnetic field coefficient.

10. The semiconductor device according to claim 9, wherein the memory cell storing the interaction coefficient and the memory cell storing the external magnetic field coefficient are formed of a memory cell group including a selector that stores a simulated coefficient string generated in advance, selects the stored simulated coefficient string according to a record of a counter, and in turn outputs the simulated coefficient in performing an interaction to determine a subsequent state of a spin of the spin units from a value of a spin from an adjacent spin unit, an interaction coefficient, and an external magnetic field coefficient.

* * * * *